(12) United States Patent
Sengoku et al.

(10) Patent No.: US 9,337,997 B2
(45) Date of Patent: May 10, 2016

(54) TRANSCODING METHOD FOR MULTI-WIRE SIGNALING THAT EMBEDS CLOCK INFORMATION IN TRANSITION OF SIGNAL STATE

(71) Applicant: QUALCOMM Incorporated, San Diego, CA (US)

(72) Inventors: Shoichiro Sengoku, San Diego, CA (US); George Alan Wiley, San Diego, CA (US); Chulkyu Lee, San Diego, CA (US); Joseph Cheung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/199,898

(22) Filed: Mar. 6, 2014

(65) Prior Publication Data

US 2014/0254732 A1 Sep. 11, 2014

Related U.S. Application Data

(60) Provisional application No. 61/774,408, filed on Mar. 7, 2013, provisional application No. 61/778,768, filed on Mar. 13, 2013, provisional application No. 61/774,247, filed on Mar. 7, 2013.

(51) Int. Cl.
*H04L 27/00* (2006.01)
*H04L 7/033* (2006.01)
(Continued)

(52) U.S. Cl.
CPC .............. *H04L 7/033* (2013.01); *H03K 5/1252* (2013.01); *H03K 5/1534* (2013.01);
(Continued)

(58) Field of Classification Search
CPC ................. H03K 19/018528; H04L 25/0272; H04L 25/4906; H04L 12/40; H04B 3/00; G06F 13/4282; G06F 13/4027; H03M 5/145
USPC ................... 375/259, 256, 257, 295
See application file for complete search history.

(56) References Cited

U.S. PATENT DOCUMENTS

| | | | |
|---|---|---|---|
| 4,644,547 | A | 2/1987 | Vercellotti et al. |
| 4,839,907 | A | 6/1989 | Saneski |

(Continued)

FOREIGN PATENT DOCUMENTS

| | | |
|---|---|---|
| DE | 3329773 A1 | 2/1985 |
| DE | 102004013093 B3 | 7/2005 |

(Continued)

OTHER PUBLICATIONS

International Search Report and Written Opinion—PCT/US2014/021979—ISA/EPO—Jun. 26, 2014.

(Continued)

*Primary Examiner* — Tesfaldet Bocure
(74) *Attorney, Agent, or Firm* — Loza & Loza, LLP

(57) ABSTRACT

A method for performing multi-wire signaling encoding is provided in which a clock signal is encoded within symbol transitions. A sequence of data bits is converted into a plurality of m transition numbers. Each transition number is converted into a sequential symbol number from a set of sequential symbol numbers. The sequential symbol number is converted into a raw symbol that can be transmitted over a plurality of differential drivers. The raw symbol is transmitted spread over a plurality of n wires, wherein the clock signal is effectively embedded in the transmission of raw symbols since the conversion from transition number into a sequential symbol number guarantees that no two consecutive raw symbols are the same. The raw symbol is guaranteed to have a non-zero differential voltage across all pairs of the plurality of n wires.

20 Claims, 30 Drawing Sheets

(51) Int. Cl.

| | | |
|---|---|---|
| *H04L 7/027* | (2006.01) | |
| *H04L 7/00* | (2006.01) | |
| *H04L 25/49* | (2006.01) | |
| *H04L 25/493* | (2006.01) | |
| *H03K 5/1252* | (2006.01) | |
| *H03K 5/1534* | (2006.01) | |
| *H04L 25/14* | (2006.01) | |
| *H04L 25/02* | (2006.01) | |

(52) U.S. Cl.
CPC ............ *H04L 7/0066* (2013.01); *H04L 7/027* (2013.01); *H04L 25/14* (2013.01); *H04L 25/49* (2013.01); *H04L 25/493* (2013.01); *H04L 25/4906* (2013.01); *H04L 25/0272* (2013.01)

(56) References Cited

U.S. PATENT DOCUMENTS

| | | |
|---|---|---|
| 5,493,538 A | 2/1996 | Bergman |
| 5,703,914 A | 12/1997 | Nakamura |
| 5,862,180 A | 1/1999 | Heinz |
| 5,959,568 A | 9/1999 | Woolley |
| 6,320,406 B1 | 11/2001 | Morgan et al. |
| 6,320,437 B1 | 11/2001 | Ma |
| 6,526,112 B1 | 2/2003 | Lai |
| 6,556,628 B1 | 4/2003 | Poulton et al. |
| 6,624,766 B1 | 9/2003 | Possley et al. |
| 6,728,908 B1 | 4/2004 | Fukuhara et al. |
| 6,836,522 B1 | 12/2004 | Wakayama |
| 6,874,097 B1 | 3/2005 | Aliahmad et al. |
| 6,933,866 B1 | 8/2005 | Weitz |
| 7,061,939 B1 | 6/2006 | Chengson et al. |
| 7,076,377 B2 | 7/2006 | Kim et al. |
| 7,167,527 B1 | 1/2007 | Park et al. |
| 7,190,754 B1 | 3/2007 | Chang et al. |
| 7,339,502 B2 | 3/2008 | Furtner |
| 7,358,869 B1 | 4/2008 | Chiarulli et al. |
| 7,395,347 B2 | 7/2008 | Nemawarkar et al. |
| 7,463,680 B2 | 12/2008 | Buckwalter et al. |
| 7,502,953 B2 | 3/2009 | Boecker et al. |
| 7,667,500 B1 | 2/2010 | Alfke |
| 7,715,509 B2 | 5/2010 | Stojanovic et al. |
| 7,741,876 B2 | 6/2010 | Fusayasu et al. |
| 7,781,677 B2 | 8/2010 | Matsubara et al. |
| 7,983,347 B2 | 7/2011 | Hamada et al. |
| 8,000,412 B1 | 8/2011 | Loinaz |
| 8,159,376 B2 | 4/2012 | Abbasfar |
| 8,184,760 B2 | 5/2012 | Chien et al. |
| 8,264,253 B2 | 9/2012 | Tian et al. |
| 8,284,848 B2 | 10/2012 | Nam et al. |
| 8,446,903 B1 | 5/2013 | Ranganathan et al. |
| 8,621,128 B2 | 12/2013 | Radulescu et al. |
| 8,659,957 B2 | 2/2014 | Sekine |
| 8,686,754 B2 | 4/2014 | Chopra et al. |
| 8,848,810 B2 | 9/2014 | Lee et al. |
| 9,071,220 B2 | 6/2015 | Sengoku et al. |
| 2004/0203559 A1 | 10/2004 | Stojanovic et al. |
| 2005/0053171 A1 | 3/2005 | Pickering et al. |
| 2005/0069071 A1 | 3/2005 | Kim et al. |
| 2005/0104649 A1 | 5/2005 | Yonezawa |
| 2005/0140415 A1 | 6/2005 | Hazucha et al. |
| 2005/0218953 A1 | 10/2005 | Slawecki |
| 2006/0006902 A1 | 1/2006 | Sagiv |
| 2006/0061494 A1 | 3/2006 | Hosaka et al. |
| 2006/0132335 A1 | 6/2006 | Kojima |
| 2007/0073932 A1 | 3/2007 | Pike et al. |
| 2007/0188187 A1 | 8/2007 | Oliva et al. |
| 2007/0241836 A1 | 10/2007 | Miller |
| 2008/0063127 A1 | 3/2008 | Hayashi et al. |
| 2008/0159432 A1 | 7/2008 | Ng |
| 2008/0165732 A1 | 7/2008 | Kim et al. |
| 2008/0212709 A1 | 9/2008 | Wiley et al. |
| 2009/0080584 A1 | 3/2009 | Hamano et al. |
| 2009/0195699 A1 | 8/2009 | Hamada et al. |
| 2009/0243681 A1 | 10/2009 | Zerbe et al. |
| 2010/0001758 A1 | 1/2010 | Dreps et al. |
| 2010/0002819 A1 | 1/2010 | Conner |
| 2010/0027607 A1 | 2/2010 | Kwasniewski et al. |
| 2010/0040169 A1 | 2/2010 | Abbasfar |
| 2010/0111207 A1 | 5/2010 | Suda et al. |
| 2010/0215118 A1* | 8/2010 | Ware et al. ............... 375/295 |
| 2010/0264967 A1 | 10/2010 | Lee et al. |
| 2011/0013707 A1 | 1/2011 | Walker et al. |
| 2011/0176646 A1 | 7/2011 | Pal et al. |
| 2011/0197086 A1 | 8/2011 | Rivoir |
| 2011/0216863 A1 | 9/2011 | Tomita et al. |
| 2011/0249781 A1 | 10/2011 | Guillot et al. |
| 2012/0020660 A1 | 1/2012 | Le Taillandier De Gabory et al. |
| 2012/0213299 A1 | 8/2012 | Cronie et al. |
| 2012/0223754 A1 | 9/2012 | Lewis |
| 2012/0224656 A1 | 9/2012 | Aoki |
| 2013/0225067 A1 | 8/2013 | Card et al. |
| 2013/0241759 A1 | 9/2013 | Wiley et al. |
| 2013/0279551 A1 | 10/2013 | Fujimori et al. |
| 2013/0294490 A1 | 11/2013 | Chandrasekaran et al. |
| 2014/0254733 A1 | 9/2014 | Sengoku et al. |
| 2014/0270026 A1 | 9/2014 | Sengoku et al. |
| 2014/0286389 A1 | 9/2014 | Zerbe et al. |
| 2014/0286466 A1 | 9/2014 | Sengoku et al. |
| 2014/0348214 A1 | 11/2014 | Sengoku et al. |
| 2015/0043358 A1* | 2/2015 | Wiley et al. ............... 370/242 |
| 2015/0098536 A1 | 4/2015 | Sengoku |
| 2015/0098537 A1 | 4/2015 | Sengoku |
| 2015/0098538 A1 | 4/2015 | Wiley et al. |
| 2015/0220472 A1 | 8/2015 | Sengoku |
| 2015/0295701 A1 | 10/2015 | Sengoku |
| 2016/0028534 A1 | 1/2016 | Sengoku |

FOREIGN PATENT DOCUMENTS

| | | |
|---|---|---|
| EP | 1385306 A1 | 1/2004 |
| GB | 2456517 A | 7/2009 |
| JP | 2008242884 A | 10/2008 |
| WO | WO-2007009038 A2 | 1/2007 |
| WO | WO-2008109478 A2 | 9/2008 |
| WO | WO-2008151251 A1 | 12/2008 |
| WO | WO-2009086078 A1 | 7/2009 |
| WO | WO-2009111175 A1 | 9/2009 |

OTHER PUBLICATIONS

Bell A G., et al., "WAM 7.1: A Single Chip NMOS Ethernet Controller", IEEE: International Solid—State Circuits Conference, XX, XX, Feb. 23, 1983, XP001039599, pp. 13-78.

Muller P., et al., "Top-Down Design of a Low-Power Multi-Channel 2.5-Gbit/s/Channel Gated Oscillator Clock-Recovery Circuit", Design, Automation and Test in Europe, 2005. Proceedings Munich, Germany Mar. 7-11, 2005, Piscataway, NJ, USA, IEEE, Mar. 7, 2005, pp. 258-263, XP010779962, ISBN: 978-0-7695-2288-3.

Vitesse, "VSC7226 Quad 3.125Gb/s Backplane Transceiver," VITESSE Semiconductor Corporation, PB-VSC7226-002, 2002, 2 Pages.

"Draft MIPI Alliance Specification for Camera Serial Interface 2 (CSI-2)" In:"Draft MIPI Alliance Specification for Camera Serial Interface 2 (CSI-2)", Apr. 2, 2009, XP055165978, 6. Camera Control Interface (CCI) 529-728.

"MIPI Alliance Specification for D-PHY," Sep. 22, 2009, pp. 1-125, XP055057664 [Retrieved on Mar. 25, 2013].

Poulton J W., et al., "Multiwire Differential Signaling", Aug. 6, 2003 No. 1.1 Aug. 6, 2003, pp. 1-20, XP002610849, Retrieved from the Internet: URL:http://www.cs.unc.eduf-jpfmwire.pdf [retrieved on Nov. 23, 2010] the whole document.

Williams A., "Synopsys describes MIPI DigRF protocol for 4G mobile," Retrieved from the Internet &It;URL: http://www.electronicsweekly.com/news/design/eda-and-ip/synopsys-describes-mipi-digrf-protocol-for-4g-mobile-2012-03/ >, 2012, 6 Pages.

(56) References Cited

OTHER PUBLICATIONS

Zhu C., et al., "Multi-Machine Communication Based on I2C-Bus," Sensors & Transducers, Jul. 2014, vol. 174, (7), pp. 138-143.

Zogopoulos S., et al., "High-Speed Single-Ended Parallel Link Based on Three-Level Differential Encoding", IEEE Journal of Solid-State Circuits, IEEE Service Center, Piscataway, NJ, USA, vol. 44, No. 2, Feb. 1, 2009, pp. 549-557, XP011243176, ISSN: 0018-9200, DOI: 10.1109/JSSC.2008.2011038 the whole document.

\* cited by examiner

Sequential Symbol Number

| Previous Symbol Ps | Current Symbol Cs | Transition Number T |
|---|---|---|
| 0 | 1 | 0 |
|   | 2 | 1 |
|   | 3 | 2 |
|   | 4 | 3 |
|   | 5 | 4 |
| 1 | 0 | 4 |
|   | 2 | 0 |
|   | 3 | 1 |
|   | 4 | 2 |
|   | 5 | 3 |
| 2 | 0 | 3 |
|   | 1 | 4 |
|   | 3 | 0 |
|   | 4 | 1 |
|   | 5 | 2 |
| ... | | |
| 5 | 0 | 0 |
|   | 1 | 1 |
|   | 2 | 2 |
|   | 3 | 3 |
|   | 4 | 4 |

802

Sequential Symbol # Ordering Circle (S0, S1, S2, S3, S4, S5) — 804

FIG. 8

Symbol Number Conversion for n=3 is as Simple as:

V[2:0]={Z,Y,X}==6 ? 0 : {Z,Y,X};

{Z,Y,X}=V[2:0]==0 ? 6 : V[2:0];

| Raw Symbol | | | Seq. Symbol # | "3-phase" Symbol | |
|---|---|---|---|---|---|
| Z | Y | X | V[2:0] | | |
| 1 | 1 | 0 | 0 | -x | Only Symbol {Z,Y,X}!=V[2:0] |
| 0 | 0 | 1 | 1 | +x | |
| 0 | 1 | 0 | 2 | +y | |
| 0 | 1 | 1 | 3 | -z | |
| 1 | 0 | 0 | 4 | +z | |
| 1 | 0 | 1 | 5 | -y | |

FIG. 9

Tetrahedron: Differential Voltage per 6-bits Input (1)

| S_RAW (CD, DB, AD, AC, CB, AB) | Voltage at Each R_TERM | | | | Differential Voltage | | | | | | 0 Diff Level? |
|---|---|---|---|---|---|---|---|---|---|---|---|
| | DO | CO | BO | AO | DB | CB | AD | AC | CD | AB | |
| 000000 | 1 | -1 | 3 | -3 | -2 | -4 | -4 | -2 | -2 | -6 | |
| 000001 | 1 | -1 | 1 | -1 | 0 | -2 | -2 | 0 | -2 | -2 | Zero |
| 000010 | -1 | 1 | 3 | -3 | -4 | -2 | -2 | -4 | 2 | -6 | |
| 000011 | -1 | 1 | 1 | -1 | -2 | 0 | 0 | -2 | 2 | -2 | Zero |
| 000100 | 1 | -3 | 3 | -1 | -2 | -6 | -2 | 2 | -4 | -4 | |
| 000101 | 1 | -3 | 1 | 1 | 0 | -4 | 0 | 4 | -4 | 0 | Zero |
| 000110 | -1 | -1 | 3 | -1 | -4 | -4 | 0 | 0 | 0 | -4 | Zero |
| 000111 | -1 | -1 | 1 | 1 | -2 | -2 | 2 | 2 | 0 | 0 | Zero |
| 001000 | -1 | -1 | 3 | -1 | -4 | -4 | 0 | 0 | 0 | -4 | Zero |
| 001001 | -1 | -1 | 1 | 1 | -2 | -2 | 2 | 2 | 0 | 0 | Zero |
| 001010 | -3 | 1 | 3 | -1 | -6 | -2 | 2 | -2 | 4 | -4 | |
| 001011 | -3 | 1 | 1 | 1 | -4 | 0 | 4 | 0 | 4 | 0 | Zero |
| 001100 | -1 | -3 | 3 | 1 | -4 | -6 | 2 | 4 | -2 | -2 | |
| 001101 | -1 | -3 | 1 | 3 | -2 | -4 | 4 | 6 | -2 | 2 | |
| 001110 | -3 | -1 | 3 | 1 | -6 | -4 | 4 | 2 | 2 | -2 | |
| 001111 | -3 | -1 | 1 | 3 | -4 | -2 | 6 | 4 | 2 | 2 | |
| 010000 | 1 | 1 | 1 | -3 | 0 | 0 | -4 | -4 | 0 | -4 | Zero |
| 010001 | 1 | 1 | -1 | -1 | 2 | 2 | -2 | -2 | 0 | 0 | Zero |
| 010010 | -1 | 3 | 1 | -3 | -2 | 2 | -2 | -6 | 4 | -4 | |
| 010011 | -1 | 3 | -1 | -1 | 0 | 4 | 0 | -4 | 4 | 0 | Zero |
| 010100 | 1 | -1 | 1 | -1 | 0 | -2 | -2 | 0 | -2 | -2 | Zero |
| 010101 | 1 | -1 | -1 | 1 | 2 | 0 | 0 | 2 | -2 | 2 | Zero |
| 010110 | -1 | 1 | 1 | -1 | -2 | 0 | 0 | -2 | 2 | -2 | Zero |
| 010111 | -1 | 1 | -1 | 1 | 0 | 2 | 2 | 0 | 2 | 2 | Zero |
| 011000 | -1 | 1 | 1 | -1 | -2 | 0 | 0 | -2 | 2 | -2 | Zero |
| 011001 | -1 | 1 | -1 | 1 | 0 | 2 | 2 | 0 | 2 | 2 | Zero |
| 011010 | -3 | 3 | 1 | -1 | -4 | 2 | 2 | -4 | 6 | -2 | |
| 011011 | -3 | 3 | -1 | 1 | -2 | 4 | 4 | -2 | 6 | 2 | |
| 011100 | -1 | -1 | 1 | 1 | -2 | -2 | 2 | 2 | 0 | 0 | Zero |
| 011101 | -1 | -1 | -1 | 3 | 0 | 0 | 4 | 4 | 0 | 4 | Zero |
| 011110 | -3 | 1 | 1 | 1 | -4 | 0 | 4 | 0 | 4 | 0 | Zero |
| 011111 | -3 | -1 | -1 | 3 | -2 | 2 | 6 | 2 | 4 | 4 | |

FIG. 13A

Tetrahedron: Differential Voltage per 6-bits Input (2)

| $S_{RAW}$ (CD, DB, AD, AC, CB, AB) | Voltage at Each $R_{TERM}$ | | | | Differential Voltage | | | | | | 0 Diff Level? |
|---|---|---|---|---|---|---|---|---|---|---|---|
| | DO | CO | BO | AO | DB | CB | AD | AC | CD | AB | |
| 100000 | 3 | -1 | 1 | -3 | 2 | -2 | -6 | -2 | -4 | -4 | |
| 100001 | 3 | -1 | -1 | -1 | 4 | 0 | -4 | 0 | -4 | 0 | Zero |
| 100010 | 1 | 1 | 1 | -3 | 0 | 0 | -4 | -4 | 0 | -4 | Zero |
| 100011 | 1 | 1 | -1 | -1 | 2 | 2 | -2 | -2 | 0 | 0 | Zero |
| 100100 | 3 | -3 | 1 | -1 | 2 | -4 | -4 | 2 | -6 | -2 | |
| 100101 | 3 | -3 | -1 | 1 | 4 | -2 | -2 | 4 | -6 | 2 | |
| 100110 | 1 | -1 | 1 | -1 | 0 | -2 | -2 | 0 | -2 | -2 | Zero |
| 100111 | 1 | -1 | -1 | 1 | 2 | 0 | 0 | 2 | -2 | 2 | Zero |
| 101000 | 1 | -1 | 1 | -1 | 0 | -2 | -2 | 0 | -2 | -2 | Zero |
| 101001 | 1 | -1 | -1 | 1 | 2 | 0 | 0 | 2 | -2 | 2 | Zero |
| 101010 | -1 | 1 | 1 | -1 | -2 | 0 | 0 | -2 | 2 | -2 | Zero |
| 101011 | -1 | 1 | -1 | 1 | 0 | 2 | 2 | 0 | 2 | 2 | Zero |
| 101100 | 1 | -3 | 1 | 1 | 0 | -4 | 0 | 4 | -4 | 0 | Zero |
| 101101 | 1 | -3 | -1 | 3 | 2 | -2 | 2 | 6 | -4 | 4 | |
| 101110 | -1 | -1 | 1 | 1 | -2 | -2 | 2 | 2 | 0 | 0 | Zero |
| 101111 | -1 | -1 | -1 | 3 | 0 | 0 | 4 | 4 | 0 | 4 | Zero |
| 110000 | 3 | 1 | -1 | -3 | 4 | 2 | -6 | -4 | -2 | -2 | |
| 110001 | 3 | 1 | -3 | -1 | 6 | 4 | -4 | -2 | -2 | 2 | |
| 110010 | 1 | 3 | -1 | -3 | 2 | 4 | -4 | -6 | 2 | -2 | |
| 110011 | 1 | 3 | -3 | -1 | 4 | 6 | -2 | -4 | 2 | 2 | |
| 110100 | 3 | -1 | -1 | -1 | 4 | 0 | -4 | 0 | -4 | 0 | Zero |
| 110101 | 3 | -1 | -3 | 1 | 6 | 2 | -2 | 2 | -4 | 4 | |
| 110110 | 1 | 1 | -1 | -1 | 2 | 2 | -2 | -2 | 0 | 0 | Zero |
| 110111 | 1 | 1 | -3 | 1 | 4 | 4 | 0 | 0 | 0 | 4 | Zero |
| 111000 | 1 | 1 | -1 | -1 | 2 | 2 | -2 | -2 | 0 | 0 | Zero |
| 111001 | 1 | 1 | -3 | 1 | 4 | 4 | 0 | 0 | 0 | 4 | Zero |
| 111010 | -1 | 3 | -1 | -1 | 0 | 4 | 0 | -4 | 4 | 0 | Zero |
| 111011 | -1 | 3 | -3 | 1 | 2 | 6 | 2 | -2 | 4 | 4 | |
| 111100 | 1 | -1 | -1 | 1 | 2 | 0 | 0 | 2 | -2 | 2 | Zero |
| 111101 | 1 | -1 | -3 | 3 | 4 | 2 | 2 | 4 | -2 | 6 | |
| 111110 | -1 | 1 | -1 | 1 | 0 | 2 | 2 | 0 | 2 | 2 | Zero |
| 111111 | -1 | 1 | -3 | 3 | 2 | 4 | 4 | 2 | 2 | 6 | |

FIG. 13B

Manually Assigned Raw Symbol ↔ Number Conversion Table

| | S_RAW (CD, DB, AD, AC, CB, AB) | Voltage at Each R_TERM | | | | Differential Voltage | | | | | | S(4:0) |
|---|---|---|---|---|---|---|---|---|---|---|---|---|
| | | DO | CO | BO | AO | DB | CB | AD | AC | CD | AB | |
| Base 16 Symbols "Main" | 010010 | -1 | 3 | 1 | -3 | -2 | 2 | -2 | -6 | 4 | -4 | 0x0 |
| | 001101 | -1 | -3 | 1 | 3 | -2 | -4 | 4 | 6 | -2 | 2 | 0x1 |
| | 110010 | 1 | 3 | -1 | -3 | 2 | 4 | -4 | -6 | 2 | -2 | 0x2 |
| | 101101 | 1 | -3 | -1 | 3 | 2 | -2 | 2 | 6 | -4 | 4 | 0x3 |
| | 100000 | 3 | -1 | 1 | -3 | 2 | -2 | -6 | -2 | -4 | -4 | 0x4 |
| | 001111 | -3 | -1 | 1 | 3 | -4 | -2 | 6 | 4 | 2 | 2 | 0x5 |
| | 110000 | 3 | 1 | -1 | -3 | 4 | 2 | -6 | -4 | -2 | -2 | 0x6 |
| | 011111 | -3 | 1 | -1 | 3 | -2 | 2 | 6 | 2 | 4 | 4 | 0x7 |
| | 000100 | 1 | -3 | 3 | -1 | -2 | -6 | -2 | 2 | -4 | -4 | 0x8 |
| | 110011 | 1 | 3 | -3 | -1 | 4 | 6 | -2 | -4 | 2 | 2 | 0x9 |
| | 001100 | -1 | -3 | 3 | 1 | -4 | -6 | 2 | 4 | -2 | -2 | 0xA |
| | 111011 | -1 | 3 | -3 | 1 | 2 | 6 | 2 | -2 | 4 | 4 | 0xB |
| | 001010 | -3 | 1 | 3 | -1 | -6 | -2 | 2 | -2 | 4 | -4 | 0xC |
| | 110001 | 3 | 1 | -3 | -1 | 6 | 4 | -4 | -2 | -2 | 2 | 0xD |
| | 001110 | -3 | -1 | 3 | 1 | -6 | -4 | 4 | 2 | 2 | -2 | 0xE |
| Alternative symbols "Alt" | 110101 | 3 | -1 | -3 | 1 | 6 | 2 | -2 | 2 | -4 | 4 | 0xF |
| | 011010 | -3 | 3 | 1 | -1 | -4 | 2 | 2 | -4 | 6 | -2 | 0x10 |
| | 011011 | -3 | 3 | -1 | 1 | -2 | 4 | 4 | -2 | 6 | 2 | 0x11 |
| | 100100 | 3 | -3 | 1 | -1 | 2 | -4 | -4 | 2 | -6 | -2 | 0x12 |
| | 100101 | 3 | -3 | -1 | 1 | 4 | -2 | -2 | 4 | -6 | 2 | 0x13 |
| | 000000 | 1 | -1 | 3 | -3 | -2 | -4 | -4 | -2 | -2 | -6 | 0x14 |
| | 111101 | 1 | -1 | -3 | 3 | 4 | 2 | 2 | 4 | -2 | 6 | 0x15 |
| | 000010 | -1 | 1 | 3 | -3 | -4 | -2 | -2 | -4 | 2 | -6 | 0x16 |
| | 111111 | -1 | 1 | -3 | 3 | 2 | 4 | 4 | 2 | 2 | 6 | 0x17 |

FIG. 14

| n | Utilization % | Symbol /group | Bits/group | Int(bpg) | Bits/cycle | Bits/wire | Bits/wire x2 |
|---|---|---|---|---|---|---|---|
| 3 | 99.98 | 28 | 65.0140 | 65 | 2.3214 | 0.7738 | 1.5476 |
| 3 | 99.92 | 25 | 58.0482 | 58 | 2.3200 | 0.7733 | 1.5467 |
| 3 | 99.84 | 22 | 51.0824 | 51 | 2.3182 | 0.7727 | 1.5455 |
| 3 | 99.74 | 19 | 44.1166 | 44 | 2.3158 | 0.7719 | 1.5439 |
| 3 | 99.59 | 32 | 74.3017 | 74 | 2.3125 | 0.7708 | 1.5417 |
| 3 | 99.59 | 16 | 37.1508 | 37 | 2.3125 | 0.7708 | 1.5417 |
| 3 | 99.50 | 29 | 67.3359 | 67 | 2.3103 | 0.7701 | 1.5402 |
| 3 | 99.39 | 26 | 60.3701 | 60 | 2.3077 | 0.7692 | 1.5385 |
| 3 | 99.39 | 13 | 30.1851 | 30 | 2.3077 | 0.7692 | 1.5385 |
| 3 | 99.24 | 23 | 53.4043 | 53 | 2.3043 | 0.7681 | 1.5362 |
| 3 | 99.06 | 30 | 69.6578 | 69 | 2.3000 | 0.7667 | 1.5333 |
| 3 | 99.06 | 20 | 46.4386 | 46 | 2.3000 | 0.7667 | 1.5333 |
| 3 | 99.06 | 10 | 23.2193 | 23 | 2.3000 | 07667 | 1.5333 |
| 3 | 98.90 | 27 | 62.6921 | 62 | 2.2963 | 0.7654 | 1.5309 |
| 3 | 98.80 | 17 | 39.4728 | 39 | 2.2941 | 0.7647 | 1.5294 |
| 3 | 98.70 | 24 | 55.7263 | 55 | 2.2917 | 0.7639 | 1.5278 |
| 3 | 98.64 | 31 | 71.9798 | 71 | 2.2903 | 0.7634 | 1.5269 |
| 3 | 98.44 | 21 | 48.7605 | 48 | 2.2857 | 0.7619 | 1.5238 |
| 3 | 98.44 | 14 | 32.5070 | 32 | 2.2857 | 0.7619 | 1.5238 |
| 3 | 98.44 | 7 | 16.2535 | 16 | 2.2857 | 0.7619 | 1.5238 |
| 3 | 98.10 | 18 | 41.7947 | 41 | 2.2778 | 0.7593 | 1.5185 |
| 3 | 97.88 | 11 | 25.5412 | 25 | 2.2727 | 0.7576 | 1.5152 |
| 3 | 97.62 | 15 | 34.8289 | 34 | 2.2667 | 0.7556 | 1.5111 |
| 3 | 96.90 | 12 | 27.8631 | 27 | 2.2500 | 0.7500 | 1.5000 |
| 3 | 96.90 | 8 | 18.5754 | 18 | 2.2500 | 0.7500 | 1.5000 |
| 3 | 96.90 | 4 | 9.2877 | 9 | 2.2500 | 0.7500 | 1.5000 |
| 3 | 95.71 | 9 | 20.8974 | 20 | 2.2222 | 0.7407 | 1.4815 |
| 3 | 94.75 | 5 | 11.6096 | 11 | 2.2000 | 0.7333 | 1.4667 |
| 3 | 93.31 | 6 | 13.9316 | 13 | 2.1667 | 0.7222 | 1.4444 |
| 3 | 86.14 | 3 | 6.9658 | 6 | 2.0000 | 0.6667 | 1.3333 |
| 3 | 86.14 | 2 | 4.6439 | 4 | 2.0000 | 0.6667 | 1.3333 |
| 3 | 86.14 | 1 | 2.3219 | 2 | 2.0000 | 0.6667 | 1.3333 |

FIG. 20

| n | Utilization % | Symbol /group | Bits/group | Int(bpg) | Bits/cycle | Bits/wire | Bits/wire x2 |
|---|---|---|---|---|---|---|---|
| 4 | 99.96 | 23 | 104.0419 | 104 | 4.5217 | 1.1304 | 2.2609 |
| 4 | 99.92 | 25 | 113.0890 | 113 | 4.5200 | 1.1300 | 2.2600 |
| 4 | 99.89 | 27 | 122.1362 | 122 | 4.5185 | 1.1296 | 2.2593 |
| 4 | 99.86 | 29 | 131.1833 | 131 | 4.5172 | 1.1293 | 2.2586 |
| 4 | 99.84 | 31 | 140.2304 | 140 | 4.5161 | 1.1290 | 2.2581 |
| 4 | 99.48 | 32 | 144.7540 | 144 | 4.5000 | 1.1250 | 2.2500 |
| 4 | 99.48 | 30 | 135.7069 | 135 | 4.5000 | 1.1250 | 2.2500 |
| 4 | 99.48 | 28 | 126.6597 | 126 | 4.5000 | 1.1250 | 2.2500 |
| 4 | 99.48 | 26 | 117.6126 | 117 | 4.5000 | 1.1250 | 2.2500 |
| 4 | 99.48 | 24 | 108.5655 | 108 | 4.5000 | 1.1250 | 2.2500 |
| 4 | 99.48 | 22 | 99.5184 | 99 | 4.5000 | 1.1250 | 2.2500 |
| 4 | 99.48 | 20 | 90.4712 | 90 | 4.5000 | 1.1250 | 2.2500 |
| 4 | 99.48 | 18 | 81.4241 | 81 | 4.5000 | 1.1250 | 2.2500 |
| 4 | 99.48 | 16 | 72.3770 | 72 | 4.5000 | 1.1250 | 2.2500 |
| 4 | 99.48 | 14 | 63.3299 | 63 | 4.5000 | 1.1250 | 2.2500 |
| 4 | 99.48 | 12 | 54.2827 | 54 | 4.5000 | 1.1250 | 2.2500 |
| 4 | 99.48 | 10 | 45.2356 | 45 | 4.5000 | 1.1250 | 2.2500 |
| 4 | 99.48 | 8 | 36.1885 | 36 | 4.5000 | 1.1250 | 2.2500 |
| 4 | 99.48 | 6 | 27.1414 | 27 | 4.5000 | 1.1250 | 2.2500 |
| 4 | 99.48 | 4 | 18.0942 | 18 | 4.5000 | 1.1250 | 2.2500 |
| 4 | 99.48 | 2 | 9.0471 | 9 | 4.5000 | 1.1250 | 2.2500 |
| 4 | 98.95 | 21 | 94.9948 | 94 | 4.4762 | 1.1190 | 2.2381 |
| 4 | 98.90 | 19 | 85.9477 | 85 | 4.4737 | 1.1184 | 2.2368 |
| 4 | 98.83 | 17 | 76.9006 | 76 | 4.4706 | 1.1176 | 2.2353 |
| 4 | 98.74 | 15 | 67.8534 | 67 | 4.4667 | 1.1167 | 2.2333 |
| 4 | 98.63 | 13 | 58.8063 | 58 | 4.5615 | 1.1154 | 2.2308 |
| 4 | 98.47 | 11 | 49.7592 | 49 | 4.4545 | 1.1136 | 2.2273 |
| 4 | 98.25 | 9 | 40.7121 | 40 | 4.4444 | 1.1111 | 2.2222 |
| 4 | 97.90 | 7 | 31.6649 | 31 | 4.4286 | 1.1071 | 2.2143 |
| 4 | 97.27 | 5 | 22.6178 | 22 | 4.4000 | 1.1000 | 2.2000 |
| 4 | 95.79 | 3 | 13.5707 | 13 | 4.3333 | 1.0833 | 2.1667 |
| 4 | 88.43 | 1 | 4.5236 | 4 | 4.0000 | 1.0000 | 2.0000 |

FIG. 21

| n | Utilization % | Symbol /group | Bits/group | Int(bpg) | Bits/cycle | Bits/wire | Bits/wire x2 |
|---|---|---|---|---|---|---|---|
| 5 | 100.00 | 19 | 131.0015 | 131 | 6.8947 | 1.3789 | 2.7579 |
| 5 | 99.97 | 28 | 193.0549 | 193 | 6.8929 | 1.3786 | 2.7571 |
| 5 | 99.91 | 27 | 186.1601 | 186 | 6.8889 | 1.3778 | 2.7556 |
| 5 | 99.91 | 18 | 124.1067 | 124 | 6.8889 | 1.3778 | 2.7556 |
| 5 | 99.91 | 9 | 62.0534 | 62 | 6.8889 | 1.3778 | 2.7556 |
| 5 | 99.85 | 26 | 179.2653 | 179 | 6.8846 | 1.3769 | 2.7538 |
| 5 | 99.82 | 17 | 117.2119 | 117 | 6.8824 | 1.3765 | 2.7529 |
| 5 | 99.79 | 25 | 172.3704 | 172 | 6.8800 | 1.3760 | 2.7520 |
| 5 | 99.71 | 32 | 220.6342 | 220 | 6.8750 | 1.3750 | 2.7500 |
| 5 | 99.71 | 24 | 165.4756 | 165 | 6.8750 | 1.3750 | 2.7500 |
| 5 | 99.71 | 16 | 110.3171 | 110 | 6.8750 | 1.3750 | 2.7500 |
| 5 | 99.71 | 8 | 55.1585 | 55 | 6.8750 | 1.3750 | 2.7500 |
| 5 | 99.65 | 31 | 213.7394 | 213 | 6.8710 | 1.3742 | 2.7484 |
| 5 | 99.63 | 23 | 158.5808 | 158 | 6.8696 | 1.3739 | 2.7478 |
| 5 | 99.59 | 30 | 206.8445 | 206 | 6.8667 | 1.3733 | 2.7467 |
| 5 | 99.59 | 15 | 103.4223 | 103 | 6.8667 | 1.3733 | 2.7467 |
| 5 | 99.55 | 22 | 151.6860 | 151 | 6.8636 | 1.3727 | 2.7455 |
| 5 | 99.53 | 29 | 199.9497 | 199 | 6.8621 | 1.3724 | 2.7448 |
| 5 | 99.45 | 21 | 144.7912 | 144 | 6.8571 | 1.3714 | 2.7429 |
| 5 | 99.45 | 14 | 96.5274 | 96 | 6.8571 | 1.3714 | 2.7429 |
| 5 | 99.45 | 7 | 48.2637 | 48 | 6.8571 | 1.3714 | 2.7429 |
| 5 | 99.35 | 20 | 137.8964 | 137 | 6.8500 | 1.3700 | 2.7400 |
| 5 | 99.29 | 13 | 89.6326 | 89 | 6.8462 | 1.3692 | 2.7385 |
| 5 | 99.11 | 12 | 82.7378 | 82 | 6.8333 | 1.3667 | 2.7333 |
| 5 | 99.11 | 6 | 41.3689 | 41 | 6.8333 | 1.3667 | 2.7333 |
| 5 | 98.89 | 11 | 75.8430 | 75 | 6.8182 | 1.3636 | 2.7273 |
| 5 | 98.62 | 10 | 68.9482 | 68 | 6.8000 | 1.3600 | 2.7200 |
| 5 | 98.62 | 5 | 34.4741 | 34 | 6.8000 | 1.3600 | 2.7200 |
| 5 | 97.90 | 4 | 27.5793 | 27 | 6.7500 | 1.3500 | 2.7000 |
| 5 | 96.69 | 3 | 20.6845 | 20 | 6.6667 | 1.3333 | 2.6667 |
| 5 | 94.27 | 2 | 13.7896 | 13 | 6.5000 | 1.3000 | 2.6000 |
| 5 | 87.02 | 1 | 6.8948 | 6 | 6.0000 | 1.2000 | 2.4000 |

FIG. 22

| n | Utilization % | Symbol /group | Bits/group | Int(bpg) | Bits/cycle | Bits/wire | Bits/wire x2 |
|---|---|---|---|---|---|---|---|
| 6 | 99.94 | 31 | 294.1853 | 294 | 9.4839 | 1.5806 | 3.1613 |
| 6 | 99.93 | 29 | 275.2056 | 275 | 9.4828 | 1.5805 | 3.1609 |
| 6 | 99.91 | 27 | 256.2259 | 256 | 9.4815 | 1.5802 | 3.1605 |
| 6 | 99.90 | 25 | 237.2462 | 237 | 9.4800 | 1.5800 | 3.1600 |
| 6 | 99.88 | 23 | 218.2665 | 218 | 9.4783 | 1.5797 | 3.1594 |
| 6 | 99.86 | 21 | 199.2868 | 199 | 9.4762 | 1.5794 | 3.1587 |
| 6 | 99.83 | 19 | 180.3071 | 180 | 9.4737 | 1.5789 | 3.1579 |
| 6 | 99.80 | 17 | 161.3274 | 161 | 9.4706 | 1.5784 | 3.1569 |
| 6 | 99.78 | 32 | 303.6751 | 303 | 9.4688 | 1.5781 | 3.1556 |
| 6 | 99.76 | 30 | 284.6954 | 284 | 9.4667 | 1.5778 | 3.1556 |
| 6 | 99.76 | 15 | 142.3477 | 142 | 9.4667 | 1.5778 | 3.1556 |
| 6 | 99.73 | 28 | 265.7157 | 265 | 9.4643 | 1.5774 | 3.1548 |
| 6 | 99.70 | 26 | 246.7360 | 246 | 9.4615 | 1.5769 | 3.1538 |
| 6 | 99.70 | 13 | 123.3680 | 123 | 9.4615 | 1.5769 | 3.1538 |
| 6 | 99.67 | 24 | 227.7564 | 227 | 9.4583 | 1.5764 | 3.1528 |
| 6 | 99.63 | 22 | 208.7767 | 208 | 9.4545 | 1.5758 | 3.1515 |
| 6 | 99.63 | 11 | 104.3883 | 104 | 9.4545 | 1.5758 | 3.1515 |
| 6 | 99.58 | 20 | 189.7970 | 189 | 9.4500 | 1.5750 | 3.1500 |
| 6 | 99.52 | 18 | 170.8173 | 170 | 9.4444 | 1.5741 | 3.1481 |
| 6 | 99.52 | 9 | 85.4086 | 85 | 9.4444 | 1.5741 | 3.1481 |
| 6 | 99.45 | 16 | 151.8376 | 151 | 9.4375 | 1.5729 | 3.1458 |
| 6 | 99.35 | 14 | 132.8579 | 132 | 9.4286 | 1.5714 | 3.1429 |
| 6 | 99.35 | 7 | 66.4289 | 66 | 9.4286 | 1.5714 | 3.1429 |
| 6 | 99.23 | 12 | 113.8782 | 113 | 9.4167 | 1.5694 | 3.1389 |
| 6 | 99.05 | 10 | 94.8985 | 94 | 9.4000 | 1.5667 | 3.1333 |
| 6 | 99.05 | 5 | 47.4492 | 47 | 9.4000 | 1.5667 | 3.1333 |
| 6 | 98.79 | 8 | 75.9188 | 75 | 9.3750 | 1.5625 | 3.1250 |
| 6 | 98.35 | 6 | 56.9391 | 56 | 9.3333 | 1.5556 | 3.1111 |
| 6 | 98.35 | 3 | 28.4695 | 28 | 9.3333 | 1.5556 | 3.1111 |
| 6 | 97.47 | 4 | 37.9594 | 37 | 9.2500 | 1.5417 | 3.0833 |
| 6 | 94.84 | 2 | 18.9797 | 18 | 9.0000 | 1.5000 | 3.0000 |
| 6 | 94.84 | 1 | 9.4898 | 9 | 9.0000 | 1.5000 | 3.0000 |

FIG. 23

| n | Utilization % | Symbol /group | Bits/group | Int(bpg) | Bits/cycle | Bits/wire | Bits/wire x2 |
|---|---|---|---|---|---|---|---|
| 7 | 99.98 | 27 | 332.0709 | 332 | 12.2963 | 1.7566 | 3.5132 |
| 7 | 99.96 | 17 | 209.0817 | 209 | 12.2941 | 1.7563 | 3.5126 |
| 7 | 99.94 | 24 | 295.1741 | 295 | 12.2917 | 1.7560 | 3.5119 |
| 7 | 99.93 | 31 | 381.2666 | 381 | 12.2903 | 1.7558 | 3.5115 |
| 7 | 99.89 | 28 | 344.3698 | 344 | 12.2857 | 1.7551 | 3.5102 |
| 7 | 99.89 | 21 | 258.2774 | 258 | 12.2857 | 1.7551 | 3.5102 |
| 7 | 99.89 | 14 | 172.1849 | 172 | 12.2857 | 1.7551 | 3.5102 |
| 7 | 99.89 | 7 | 86.0925 | 86 | 12.2857 | 1.7551 | 3.5102 |
| 7 | 99.86 | 32 | 393.5655 | 393 | 12.2812 | 1.7545 | 3.5089 |
| 7 | 99.85 | 25 | 307.4730 | 307 | 12.2800 | 1.7543 | 3.5086 |
| 7 | 99.83 | 18 | 221.3806 | 221 | 12.2778 | 1.7540 | 3.5079 |
| 7 | 99.81 | 29 | 356.6687 | 356 | 12.2759 | 1.7537 | 3.5074 |
| 7 | 99.79 | 22 | 270.5763 | 270 | 12.2727 | 1.7532 | 3.5065 |
| 7 | 99.79 | 11 | 135.2881 | 135 | 12.2727 | 1.7532 | 3.5065 |
| 7 | 99.76 | 26 | 319.7720 | 319 | 12.2692 | 1.7527 | 3.5055 |
| 7 | 99.74 | 30 | 368.9677 | 368 | 12.2667 | 1.7524 | 3.5048 |
| 7 | 99.74 | 15 | 184.4838 | 184 | 12.2667 | 1.7524 | 3.5048 |
| 7 | 99.71 | 19 | 233.6795 | 233 | 12.2632 | 1.7519 | 3.5038 |
| 7 | 99.69 | 23 | 282.8752 | 282 | 12.2609 | 1.7516 | 3.5031 |
| 7 | 99.60 | 20 | 245.9784 | 245 | 12.2500 | 1.7500 | 3.5000 |
| 7 | 99.60 | 16 | 196.7827 | 196 | 12.2500 | 1.7500 | 3.5000 |
| 7 | 99.60 | 12 | 147.5871 | 147 | 12.2500 | 1.7500 | 3.5000 |
| 7 | 99.60 | 8 | 98.3914 | 98 | 12.2500 | 1.7500 | 3.5000 |
| 7 | 99.60 | 4 | 49.1957 | 49 | 12.2500 | 1.7500 | 3.5000 |
| 7 | 99.45 | 13 | 159.8860 | 159 | 12.2308 | 1.7473 | 3.4945 |
| 7 | 99.38 | 9 | 110.6903 | 110 | 12.2222 | 1.7460 | 3.4921 |
| 7 | 99.20 | 10 | 122.9892 | 122 | 12.2000 | 1.7429 | 3.4857 |
| 7 | 99.20 | 5 | 61.4946 | 61 | 12.2000 | 1.7429 | 3.4857 |
| 7 | 98.92 | 6 | 73.7935 | 73 | 12.1667 | 1.7381 | 3.4762 |
| 7 | 97.57 | 3 | 36.8968 | 36 | 12.0000 | 1.7143 | 3.4286 |
| 7 | 97.57 | 2 | 24.5978 | 24 | 12.0000 | 1.7143 | 3.4286 |
| 7 | 97.57 | 1 | 12.2989 | 12 | 12.0000 | 1.7143 | 3.4286 |

| | # of wires / pins | # of states per cycle | Bits per cycle | # of drivers / receivers | # of differential voltage level |
|---|---|---|---|---|---|
| | $n$ | $s\ (=n!)$ | $\log_2(s)$ | $d\ (=\ _nC_2)$ | $n\text{-}1$ |
| N Factorial N! | 3 | 6 | 2.58 | 3 | 2 |
| | 4 | 24 | 4.58 | 6 | 3 |
| | 5 | 120 | 6.91 | 10 | 4 |
| | 6 | 720 | 9.49 | 15 | 5 |

*FIG. 28*

TRANSCODING METHOD FOR MULTI-WIRE SIGNALING THAT EMBEDS CLOCK INFORMATION IN TRANSITION OF SIGNAL STATE

CLAIM OF PRIORITY UNDER 35 U.S.C. §119

The present application for patent claims priority to:

U.S. Provisional Application No. 61/774,408 entitled "Transcoding Method For Multi-Wire Signaling That Embeds Clock Information In Transition Of Signal State", filed Mar. 7, 2013, U.S. Provisional Application No. 61/778,768 entitled "Transcoding Method For Multi-Wire Signaling That Embeds Clock Information In Transition Of Signal State", filed Mar. 13, 2013, and U.S. Provisional Application No. 61/774,247 entitled "Circuit To Recover A Clock Signal From Multiple Wire Data Signals That Changes State Every State Cycle And Is Immune To Data Inter-Lane Skew As Well As Data State Transition Glitches", filed Mar. 7, 2013, all of which are assigned to the assignee hereof and hereby expressly incorporated by reference herein.

FIELD

The present disclosure pertains to transmitting and/or encoding a clock signal within cycles of a multi-signal data transfer.

BACKGROUND

In multi-signal data transfer, for example, multi-wire differential signaling such as 3-phase or N-factorial low-voltage differential signaling (LVDS), transcoding (e.g., the digital-to-digital data conversion of one encoding to another) may be done to embed symbol clock information by causing a symbol transition at every symbol cycle, instead of sending clock information in separate data lanes (transmission paths). Embedding clock information by such transcoding is an effective way to minimize skew between clock and data signals, as well as to eliminate the necessity of a phase-locked loop (PLL) to recover the clock information from the data signals.

Some transcoding solutions (e.g., 3-wire differential signaling and/or 3-phase signaling) have implemented embedded clock information, but lack scalability.

Therefore, an efficient transcoding method is needed that supports any number of wires used in multi-wire signaling, such as N factorial differential signaling, and any number of symbols in a group that to be transcoded from any binary number.

SUMMARY

A method for performing multi-wire signaling encoding is provided. A sequence of data bits are converted into a plurality of m transition numbers. Each transition number is converted into a sequential number from a set of sequential numbers. The sequential number is converted into a raw symbol. The raw symbol is transmitted via a plurality of differential drivers and spread over a plurality of n wires, wherein the clock signal is effectively embedded in the transmission of raw symbols since the conversion from transition number into a sequential number guarantees that no two consecutive raw symbols are the same. The raw symbol transmissions may be synchronized using the clock signal. Converting each transition number into a sequential number from a set of sequential numbers may include converting a plurality of transition numbers into a sequential number. Converting the sequential number into a raw symbol may include converting the sequential number into a plurality of raw symbols. In one example, the plurality of n wires may be greater than or equal to 3 or 4. The raw symbol is guaranteed to have a non-zero differential voltage across all pairs of the plurality of n wires. For an n factorial differential signal across the pairs of the n wires, $r^m$ possible different states are represented by the transition numbers, where r is n!−1 and m is the plurality of transition numbers. The sequential number may be selected from transition number based on a transition from an immediately previous sequential symbol number.

An encoding circuit for performing multi-wire signaling encoding is provided. A bits-to-transition number converter may convert a sequence of data bits into a plurality of m transition numbers. A transition number-to-sequential number converter may convert each transition number into a sequential number from a set of sequential numbers. A sequential number-to-raw symbol converter may convert the sequential number into a raw symbol. A plurality of differential drivers may transmit the raw symbol spread over a plurality of n wires, wherein a clock signal is effectively embedded in the transmission of raw symbols since the conversion from transition number into a sequential number guarantees that no two consecutive raw symbols are the same.

For an n factorial differential signal across pairs of the n wires, $r^m$ possible different states are represented by the transition numbers, where r is n!−1 and m is the plurality of transition numbers.

In one example, the plurality of differential drivers is equal to $_nC_2$, where $_nC_2$=n (n−1)/2. In another example, the plurality of differential drivers is equal to n.

The sequential number may be selected from the transition number based on a transition from an immediately previous sequential symbol number.

A method for performing multi-wire signaling decoding is also provided. A raw symbol is received spread over a plurality of n wires via a plurality of differential receivers. The raw symbol may be converted into a sequential number from a set of sequential numbers. Each sequential number may be converted to a transition number. A plurality of transition numbers may be converted into a sequence of data bits. A clock signal may be extracted from the reception of raw symbols. Raw symbol reception may be synchronized using the clock signal.

Converting each sequential number to a transition number may include converting a sequential number into a plurality of transition numbers. Converting the raw symbol into a sequential number from a set of sequential numbers may include converting a plurality of raw symbols into a sequential number. In various examples, the plurality of n wires is greater than or equal to 3 or 4. The raw symbol is guaranteed to have a non-zero differential voltage across all pairs of the n wires. For an n factorial differential signaling across the n drivers, $r^m$ possible different states are represented by the transition numbers, where r is n!−1. The transition number may be selected from the sequential number and based on an immediately previous sequential symbol number.

A decoding circuit for performing multi-wire signaling decoding is also provided. A plurality of differential receivers may receive a raw symbol spread over a plurality of n wires. A raw symbol-to-sequential number converter may convert the raw symbol into a sequential number from a set of sequential numbers. A sequential number-to-transition number converter may convert each sequential number to a transition number. A transition number-to-bits converter may convert a plurality of transition numbers into a sequence of data bits. A clock data recovery circuit may extract a clock signal from the reception of raw symbols. Raw symbol reception may be synchronized using the clock signal.

In one example, the plurality of differential drivers is equal to $_nC_2$, where $_nC_2=n(n-1)/2$. In another example, the plurality of differential drivers is equal to n. The transition number may be selected from the sequential number and based on an immediately previous sequential symbol number.

DRAWINGS

Various features, nature and advantages may become apparent from the detailed description set forth below when taken in conjunction with the drawings in which like reference characters identify correspondingly throughout.

FIG. 8 illustrates the conversion between sequential symbol numbers and symbol transition numbers.

FIG. 9 is a table illustrating the conversion between raw symbols (for a n=3 wire system) to a sequential symbol number.

FIG. 13 (comprising FIGS. 13A and 13B) is a table showing the various combinations of raw symbols and those symbols having zero differential voltage for n=4.

FIG. 14 illustrates a table with the non-zero differential voltage raw symbols (Sraw) that have been obtained from FIGS. 13A and 13B.

FIG. 20 illustrates a utilization table for a 3-wire system at various symbols per group.

FIG. 21 illustrates a utilization table for a 4-wire system at various symbols per group.

FIG. 22 illustrates a utilization table for a 5-wire system at various symbols per group.

FIG. 23 illustrates a utilization table for a 6-wire system at various symbols per group.

FIG. 24 illustrates a utilization table for a 7-wire system at various symbols per group.

FIG. 28 illustrates a table 2802 for N-factorial differential signaling.

DETAILED DESCRIPTION

In the following description, specific details are given to provide a thorough understanding of the embodiments. However, it will be understood by one of ordinary skill in the art that the embodiments may be practiced without these specific detail. For example, circuits may be shown in block diagrams in order not to obscure the embodiments in unnecessary detail. In other instances, well-known circuits, structures and techniques may not be shown in detail in order not to obscure the embodiments.

Overview

Various transcoding methods for conveying transcoding systems using differential signaling over a plurality of wires.

A first aspect provides multi-wire signaling encoding in which a clock signal is encoded within symbol transitions. A sequence of data bits is converted into a plurality of m transition numbers. Each transition number is converted into a sequential symbol number from a set of sequential symbol numbers. The sequential symbol number is converted into a raw symbol. The raw symbol is transmitted via a plurality differential drivers and spread over a plurality of n wires, wherein the clock signal is effectively embedded in the transmission of raw symbols since the conversion from a transition number into a sequential symbol number guarantees that no two consecutive raw symbols are the same.

A second aspect provides multi-wire signaling decoding in which a clock signal is extracted from symbol transitions. A raw symbol is received spread over a plurality of n wires via a plurality of differential receivers. The raw symbol is converted into a sequential symbol number from a set of sequential symbol numbers. Each sequential symbol number is converted to a transition number. A plurality of transition numbers are converted into a sequence of data bits. A clock signal is extracted from the transition of raw symbols.

Figure 1:
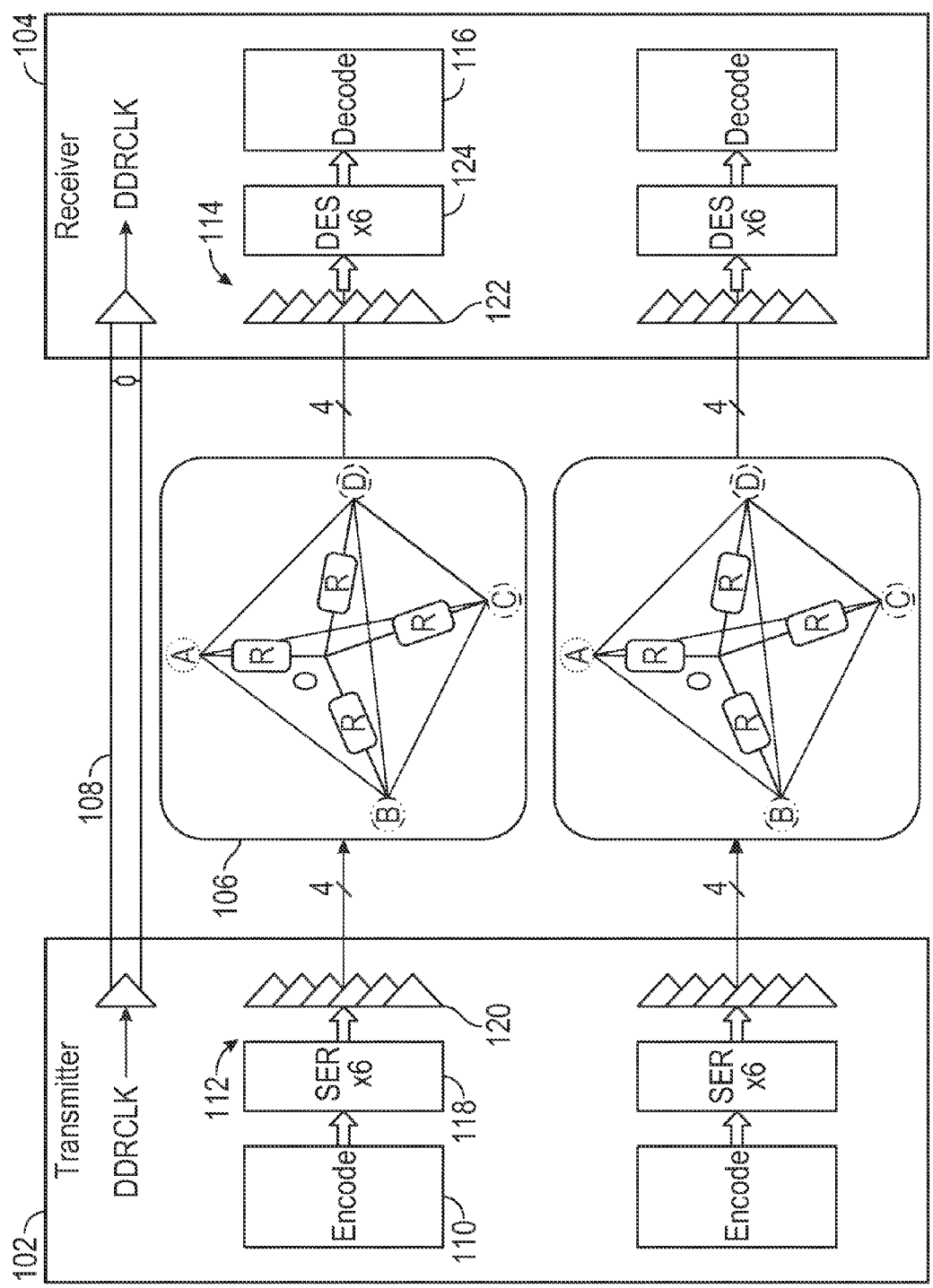
FIG. 1 illustrates a four factorial modulation data encoding/decoding scheme used between a transmitter device and a receiver device.

Exemplary Transcoding Systems with Dedicated Clock Channel and/or Phase Lock Loop Hardware FIG. 1 illustrates a four factorial modulation data encoding/decoding scheme used between a transmitter device 102 and a receiver device 104. The factorial data encoding/decoding scheme may include an encoder 110, transmitter circuit 112, physical wires (e.g., four conductors, lines, or electrical paths), a tetrahedron termination network 106, receiver circuit 114, and a decoder 116. The transmitter circuit 112 may include a serializer 118, which serializes data streams, and a plurality of drivers 120. The receiver circuit 114 may include a plurality of receivers 122 and a deserializer 124, which deserializes data streams. It should be clear that the tetrahedron termination network 106 is actually present at the interface of each of the transmitter 102 and receiver 104, and that a plurality of wires (i.e., wires A, B, C, and D in this example) are coupled between the termination networks of the transmitter 102 and receiver 104. In this example, six drivers 120 may be used to generate four differential signals transmitted over four conductors. However, other numbers of drivers and differential signals may be used in other implementations.

A separate lane may be used as a clock channel 108. The disadvantage with this approach is that it leads to data skew and requires two extra lines to implement.

Figure 2:
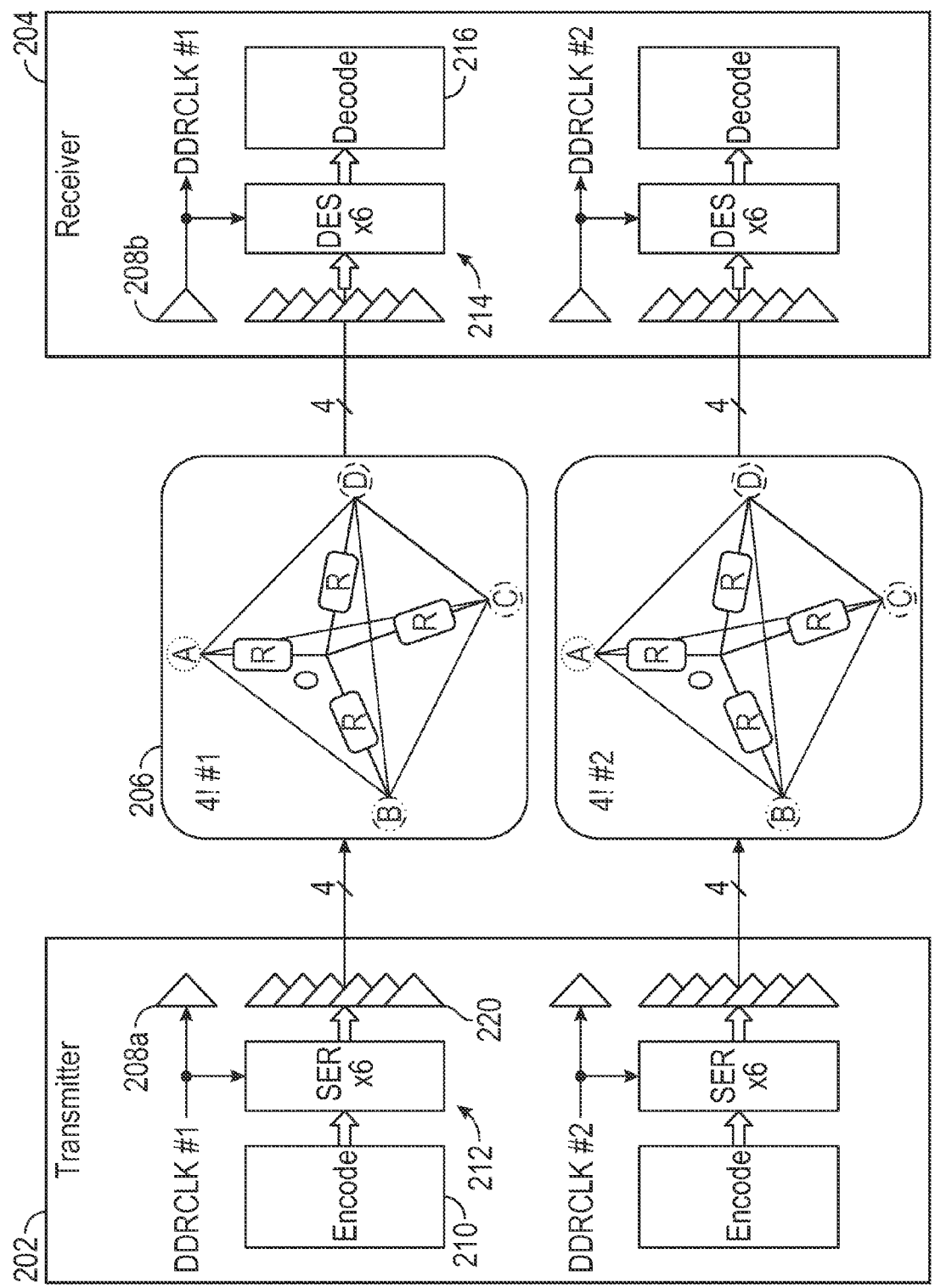
FIG. 2 illustrates another four factorial modulation data encoding/decoding scheme used between a transmitter device and a receiver device.

FIG. 2 illustrates another four factorial modulation data encoding/decoding scheme used between a transmitter device 202 and a receiver device 204. The factorial data encoding/decoding scheme may include an encoder 210, transmitter circuit 212, physical wires (e.g., four conductors or lines), a tetrahedron termination network 206, receiver circuit 214, and a decoder 216. In this example, one driver-receiver pair 208a/208b in the encoder/decoder system is now used to transmit/receive the clock signal. However, rather than using six drivers for data transmissions only five drivers 220 are used for data transmissions while one driver 208a is used for the clock signal. As a result of dedicating a driver-receiver pair 208a and 208b for the clock signal, the number of states transmitted per symbol (for data transmissions) is reduced by half. For example, in the case of 4-factorial signaling, twenty-four (24) states per symbol may normally be transferred if all bits are used for data. In the case where one driver-receiver pair is used for the clock signal, only twelve (12) states per symbols are transmitted.

Figure 3:
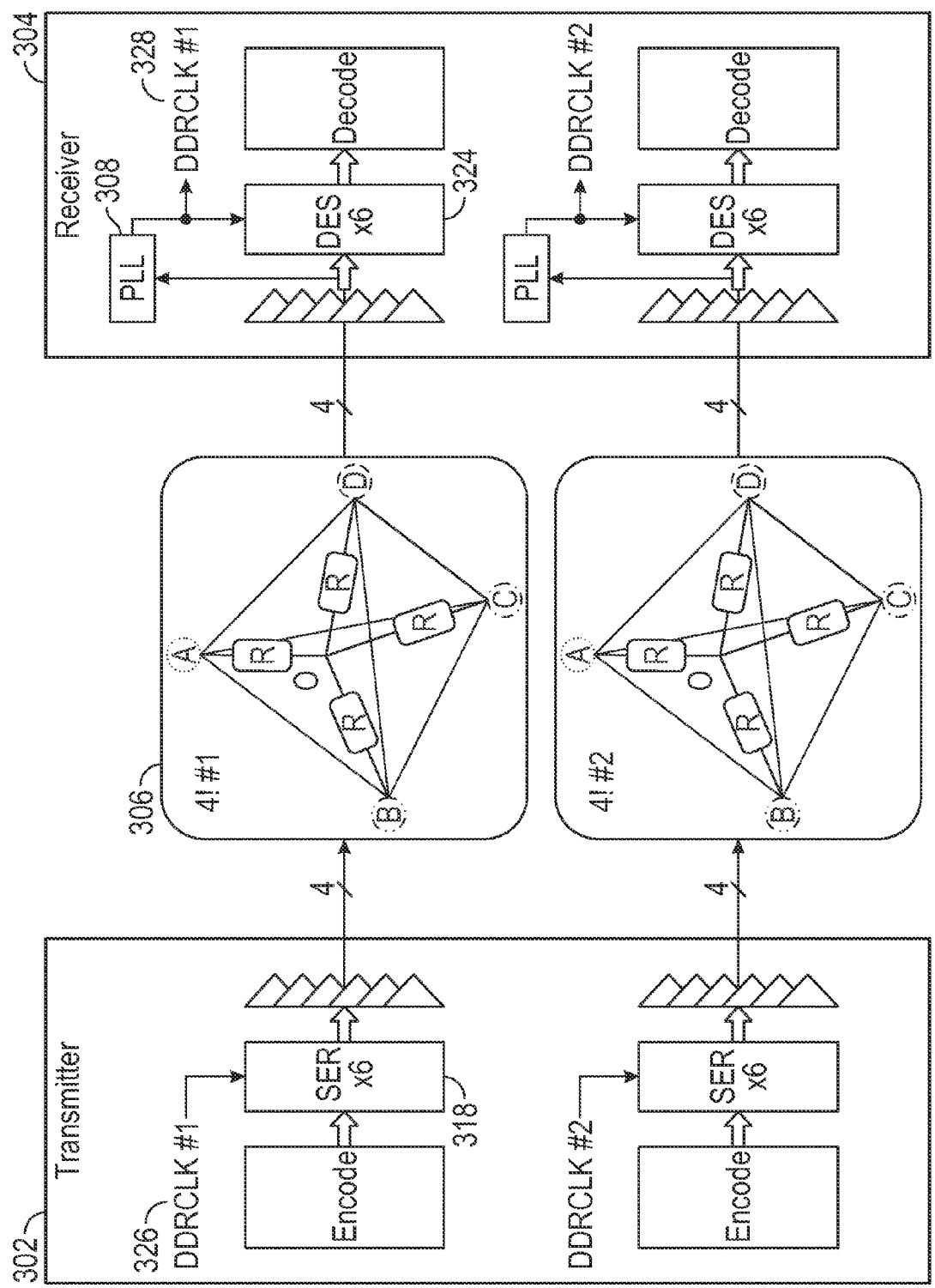
FIG. 3 illustrates another four factorial modulation data encoding/decoding scheme used between a transmitter device and a receiver device.

FIG. 3 illustrates another four factorial modulation data encoding/decoding scheme used between a transmitter device 302 and a receiver device 304. The factorial data encoding/decoding scheme may include a serializer 318, physical wires (e.g., four conductors or lines), a tetrahedron termination network 306, and a deserializer 324. In this example, the serializer 318 may be synchronized by the clock signal 326. Phase-lock loops 308 may be used at the receiver 304 to extract the clock signal 328. For example, a non-return-to-zero decoding may be implemented to extract the clock signal from the data signals. But this approach requires the phase-lock loops 308 which consume power and take up space on a semiconductor device.

Exemplary Multi-Wire System with Integrated Clock Based on Symbol Transitions

Figure 4:
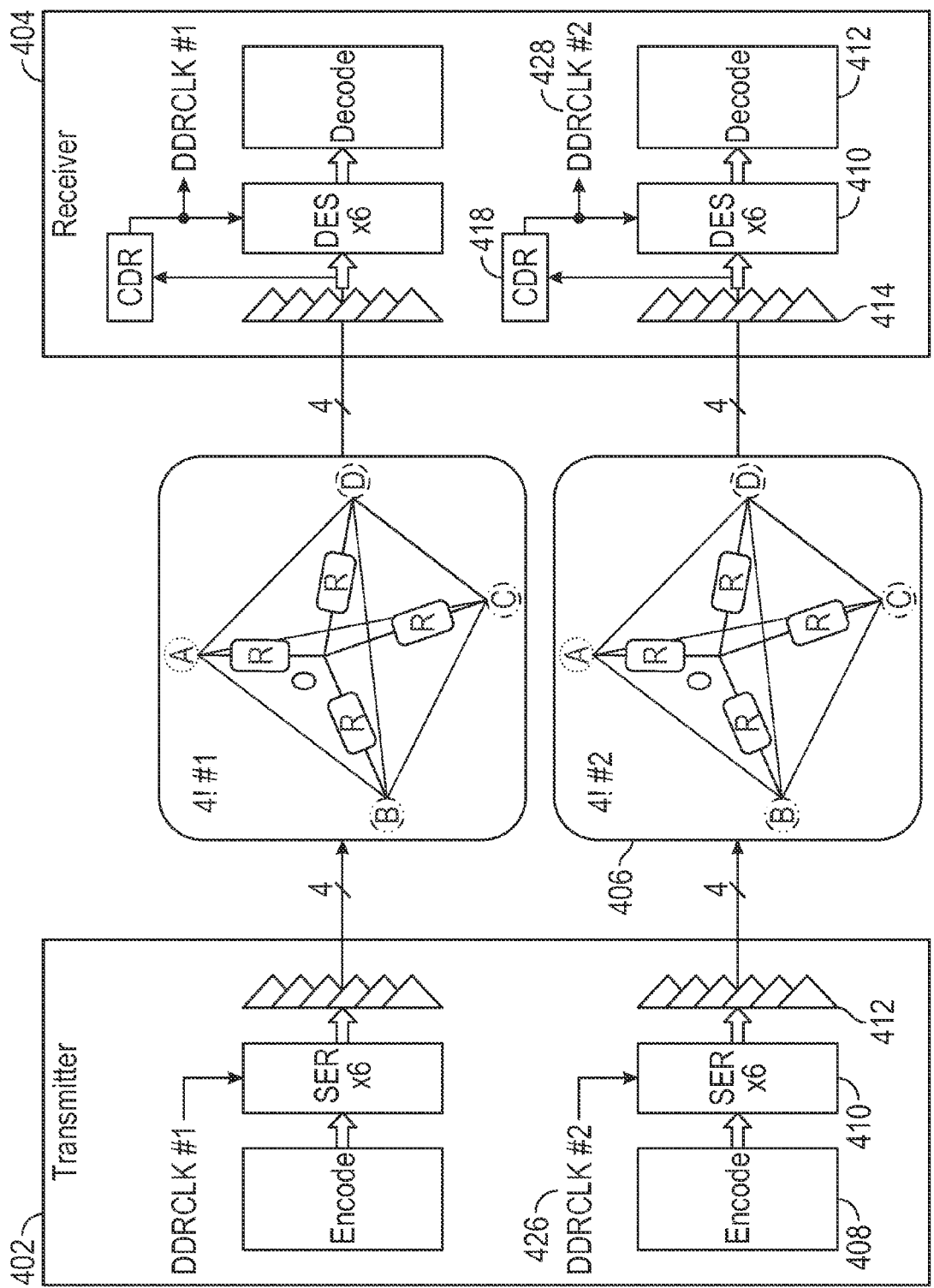
FIG. 4 illustrates another four factorial modulation data encoding/decoding scheme used between a transmitter device and a receiver device via a multi-wire transmission path.

FIG. 4 illustrates another four factorial modulation data encoding/decoding scheme used between a transmitter device 402 and a receiver device 404 via a multi-wire transmission path. At the transmitter device 402, an encoder 408, a serializer (SER) module 410, a plurality of differential drivers 412, and a termination network 406, may be adapted to implement the four factorial modulation data encoding scheme. At the receiver 404, a termination network 406, receivers or sinks 414, a deserializer (DES) module 410, and a decoder 412 may be adapted to implement the four factorial modulation data decoding scheme. It should be clear that the termination network 406 is actually present at the interface of each of the transmitter device 402 and receiver device 404, and that a plurality of wires (i.e., wires A, B, C, and D in this example) are coupled between the termination networks of the transmitter device 402 and receiver device 404.

In contrast to the approaches illustrated in FIGS. 1 and 2, or 3, the approach in FIG. 4 does not use a separate clock channel, a separate transmitter/receiver, nor non-return-to-zero decoding that requires PLL to extract clock information. Instead, a clock signal 426 may be embedded within symbol transitions carrying data. A clock data recovery circuit 418 decodes the symbol transitions to extract the clock 428.

In this approach, a plurality of wires (e.g., conductors, lines, etc.) carry differentially encoded signals carrying multiple symbols. If n wires (e.g., conductors or lines) are used to transmit a differential signal, a maximum of n!−1 symbols may be represented using the n wires. It is contemplated that the term "wire" and/or "wires" be broadly construed and include all forms of physical conductors, paths, lines, etc., that may serve to carry a signal between two points.

Within this transcoding system, the clock signal is extracted from symbol transitions. Three conversions are contemplated in this transcoding scheme: (a) between raw symbols and sequential symbol numbers, (b) between sequential symbol numbers and symbol transition numbers, and (c) between symbol transition numbers and bits. The transcoding scheme is designed so that it guarantees that consecutive raw symbols are guaranteed to be different (i.e., transition every cycle). Consequently, the raw symbol transitions can be used by the receiver 404 to generate, construct, or extract a clock signal.

Figure 5:
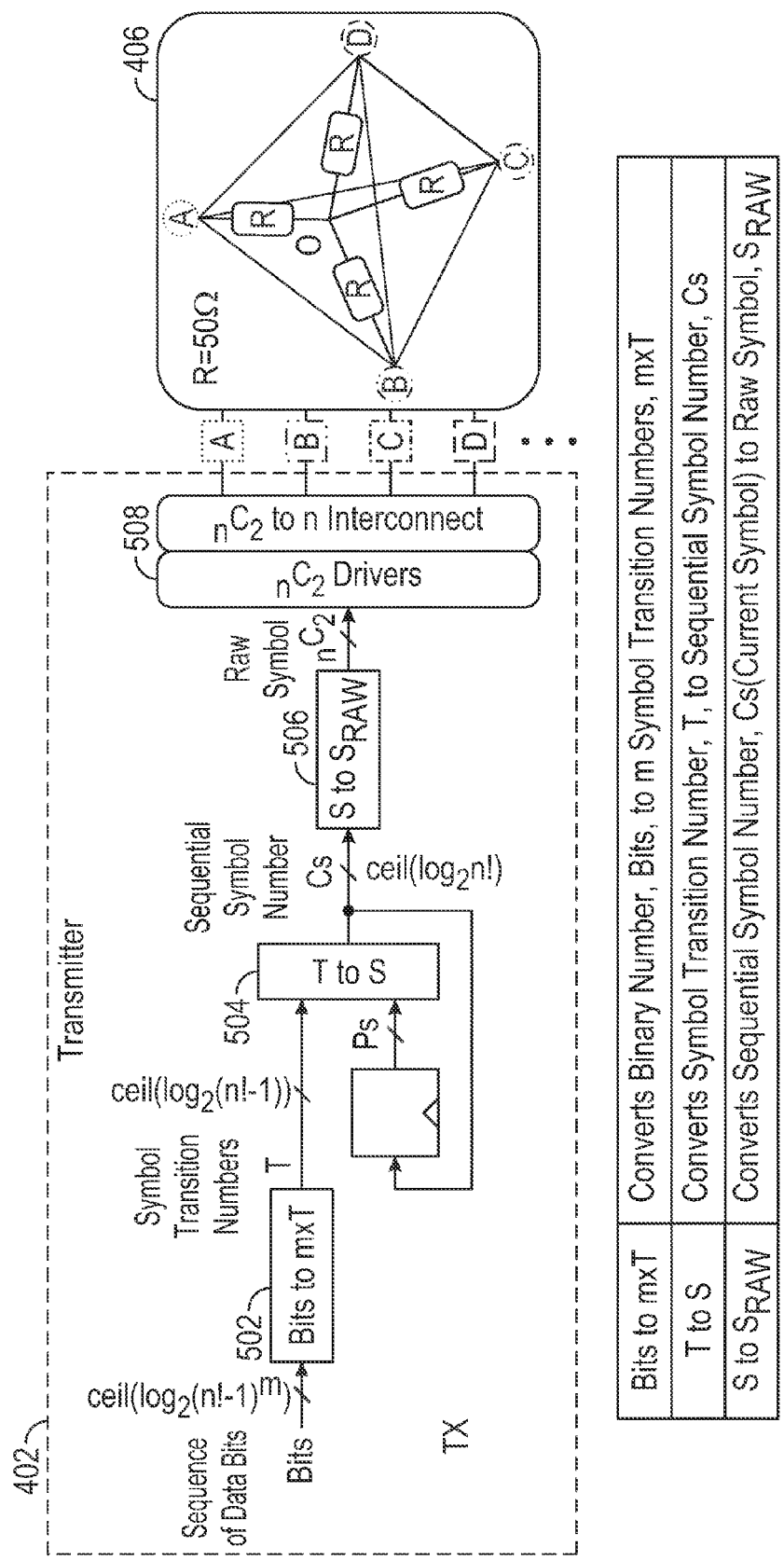
FIG. 5 is a block diagram of a transmitter (encoder) device in which a clock is integrated into symbol transitions.

FIG. 5 is a block diagram of a transmitter (encoder) device 402 in which a clock is integrated into symbol transitions. The transmitter device 402 may include a bits-to-transitions symbols converter 502, a transition-symbol-to-sequential symbol converter 504, a sequential-symbol-to-raw-symbol converter 506, and a plurality of drivers 508 that transmit the raw symbols over a plurality of n wires.

Figure 6:
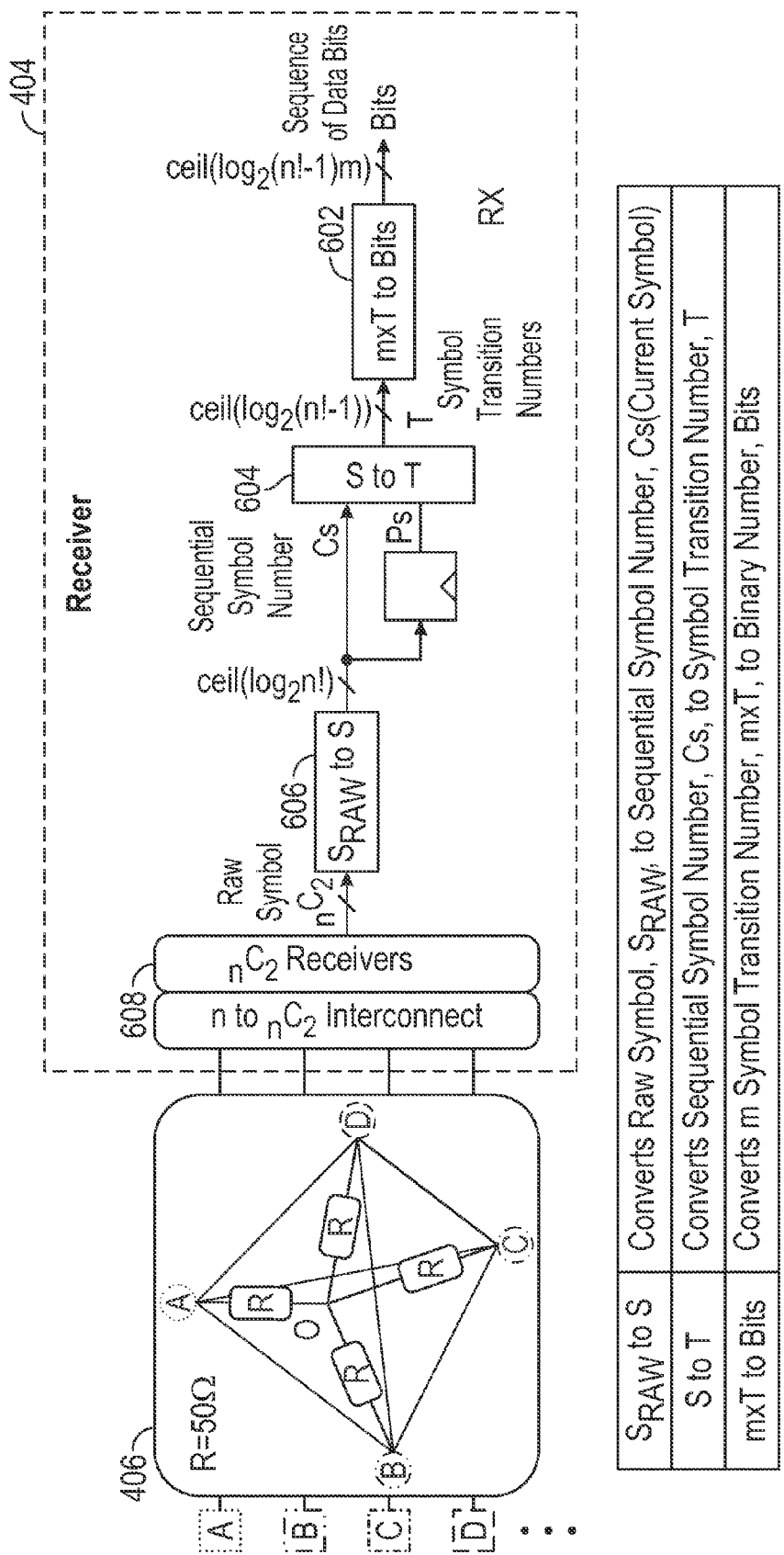
FIG. 6 is a block diagram of a receiver (decoder) device with integrated clock recovery.

FIG. 6 is a block diagram of a receiver (decoder) device 404 with integrated clock recovery. The receiver device 404 may include a plurality of receivers 608 that receive the raw symbols over a plurality of n wires, a raw-symbol-to-sequential symbol converter 606, a sequential-symbol-to-transition-symbol converter 604, and a symbol transitions-to-bits converter 602.

Exemplary Conversion Between Bits and Symbol Transition Numbers

Figure 7:
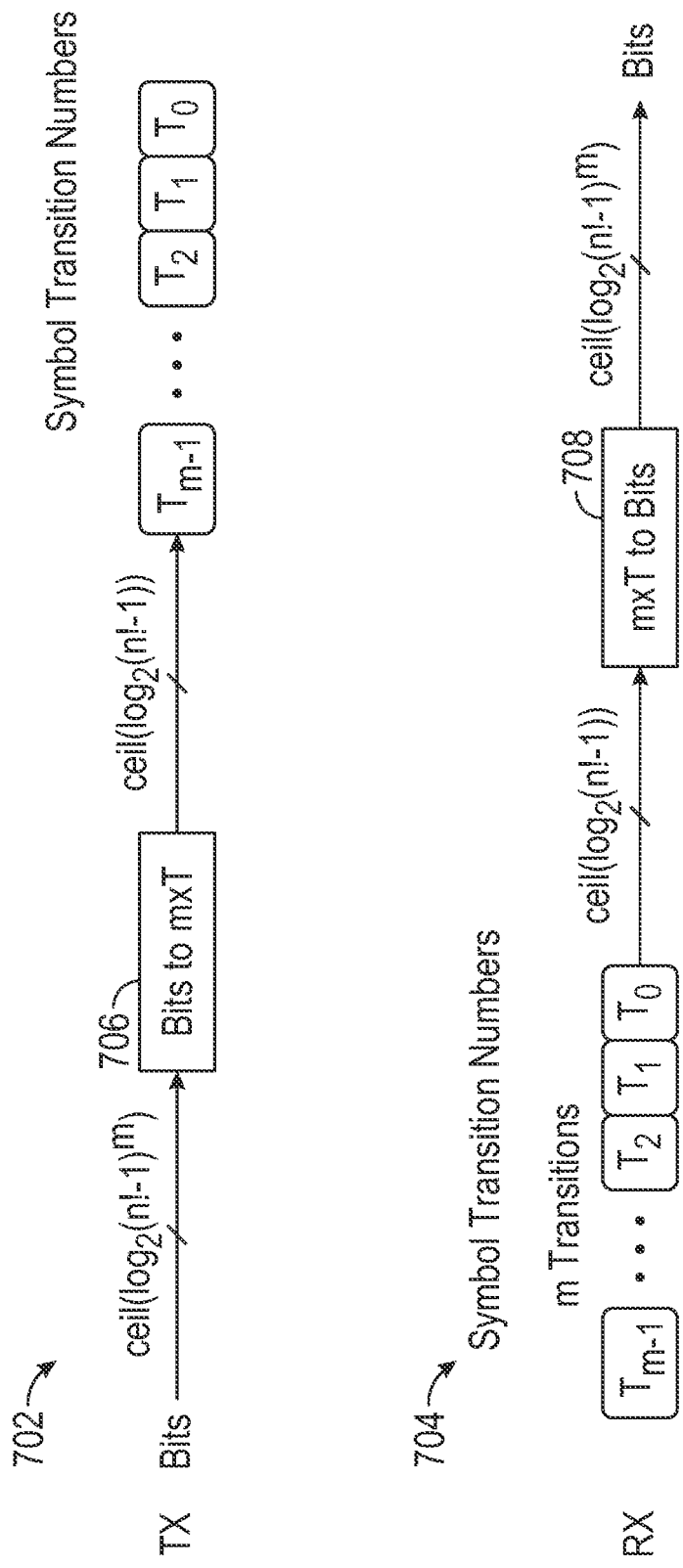
FIG. 7 illustrates the conversion from bits to symbol transition numbers at a transmitter and then from symbol transition numbers to bits at a receiver.

FIG. 7 illustrates the conversion from bits to symbol transition numbers at a transmitter 702 and then from symbol transition numbers to bits at a receiver 704. The transmitter 702 feeds binary information, Bits, into a "Bits to m×T" converter 706 to generate m symbol transition numbers, T0 to Tm−1. The receiver 704 receives m symbol transition numbers, T0 to Tm−1, which are fed into a "m×T to Bits" converter 708 to retrieve the binary information, Bits. If there are r possible symbol transition states per one T, T0 to Tm−1, m transitions can send $r^m$ different states. For N! differential signaling, r=n!−1. Consequently, transitions T0 . . . Tm−1 contain data that can have $(n!−1)^m$ different states.

In one example, it may be assumed the possible symbol transition per one T, r is 10. Lets also assume the number of symbols in a group, m is 3, such that the symbol transition number is T2, T1, T0, where Ti: 0, 1, 2, . . . , 9. Thus, each T can have 10 different states. Thus, the symbol transition number for T2, T1, T0 may be for example, a 3-digit number, such as T2=3, T1=9, T0=1 (or the decimal number 391). In this manner a sequence of bits may be converted into a plurality of symbol transition numbers T and vice versa.

In another example, 3! (n=3), it may be assumed the possible symbol transition per one T, r is 5 (=3!–1). If the number of symbols in a group, m is 4, a four-digits quinary number (base-5 number): T3, T2, T1, T0, where each Ti: 0, 1, 2, 3, 4. For example, for T3=1, T2=2, T1=0, T0=3, the quinary number is $1203_5 = 1 \times 5^3 + 2 \times 5^2 + 0 \times 5^1 + 3 \times 5^0 = 178$. In this manner, four transitions numbers may be converted into a number. Note that the transition number $1203_5$ may be used as the transition number, for example, in FIG. 8, so that each integer may be mapped to a sequential symbol and vice versa.

Figure 15:
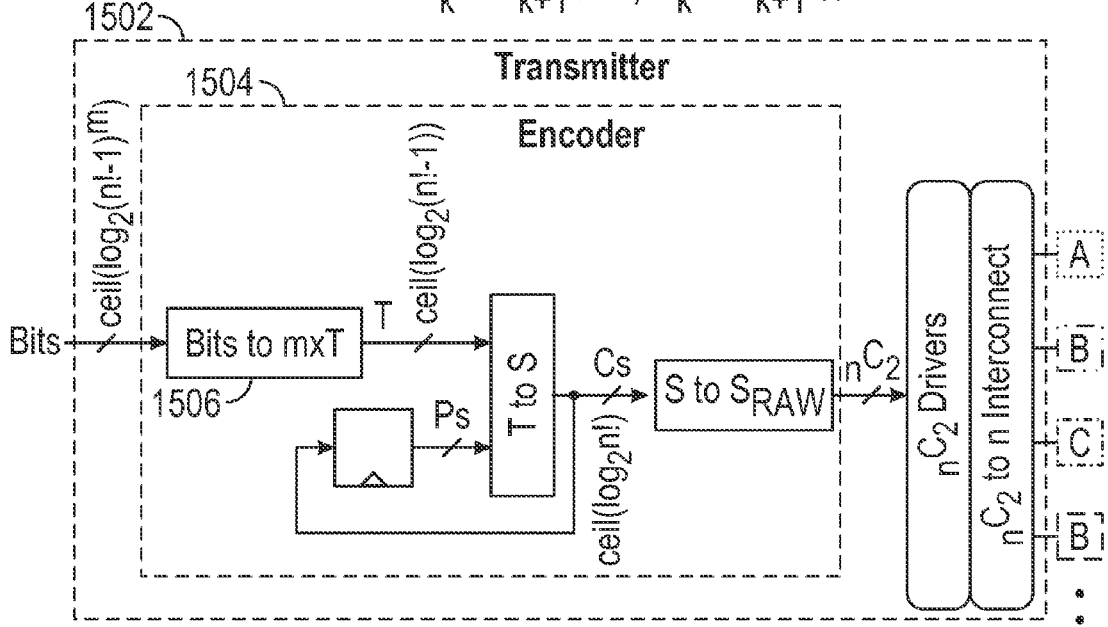
FIG. 15 is a block diagram illustrating the conversion of bits to symbol transition numbers for an n-wire system.

FIG. 15 is a block diagram illustrating the conversion of bits to symbol transition numbers for an n-wire system. This conversion from bits to symbol transition numbers T may be performed by a bits-to-symbol transition number converter 1506 within an encoder 1504 which may be part of a transmitter 1502. The transmitter 1502 and encoder 1504 may operate similar to that illustrated in FIG. 5.

Figure 16:
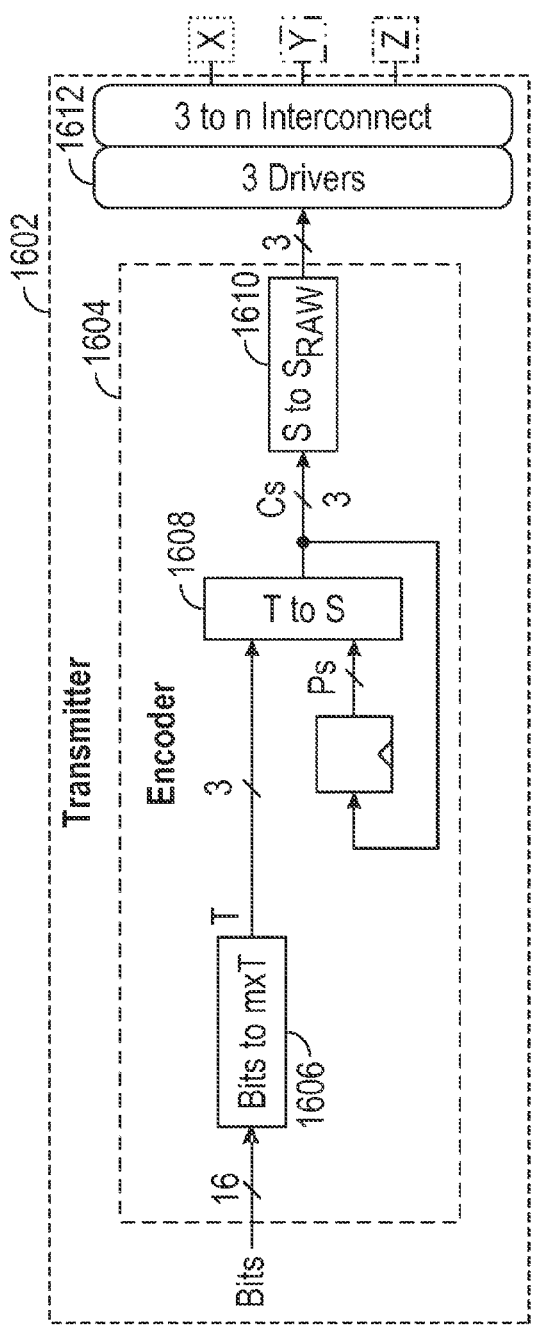
FIG. 16 is a block diagram of an exemplary encoder illustrating an example of a conversion of bits to symbol transition number for a 3-wire system (for n=3 with 7 symbols per group).

FIG. 16 is a block diagram of an exemplary encoder illustrating an example of a conversion of bits to symbol transition number for a 3-wire system (for n=3 with 7 symbols per group). A transmitter device 1602 may include an encoder 1604 that implements a bits-to-symbol transition number converter 1606, a symbol transition number-to-sequential symbol number converter 1608, and a sequential symbol number-to-raw-symbol converter 1610, and three drivers 1612 that transmit the raw symbols over a plurality of 3 wires. The transmitter 1602 and encoder 1604 may operate similar to that illustrated in FIG. 5.

Figure 17:
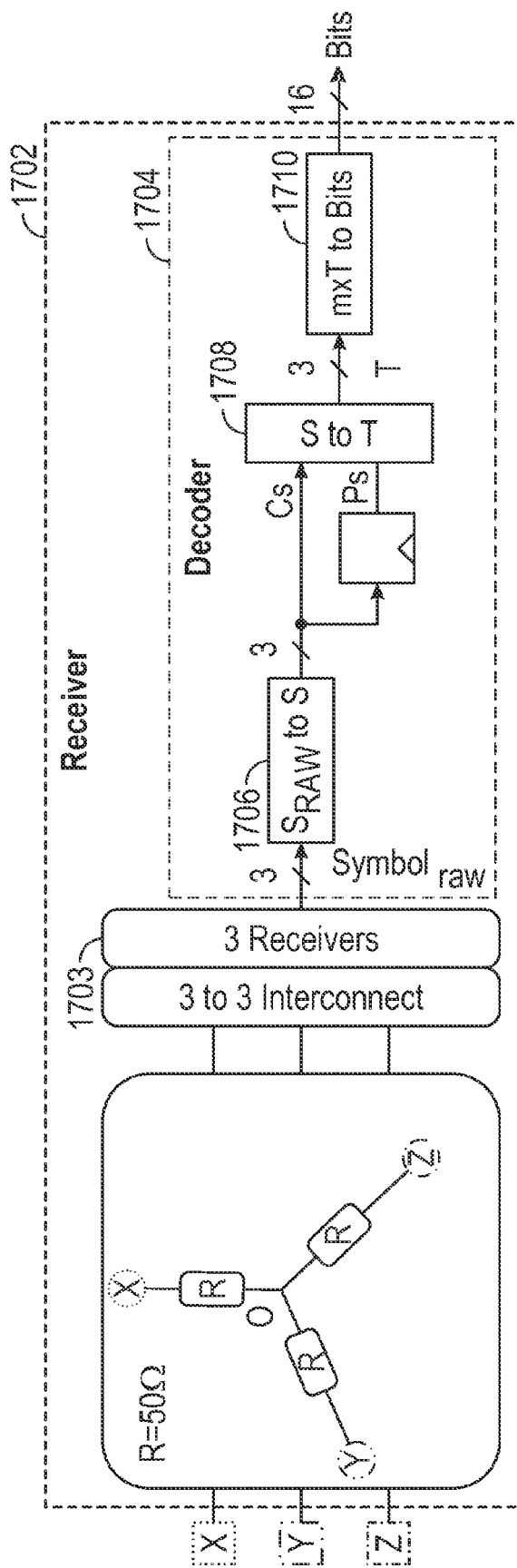
FIG. 17 is a block diagram of an exemplary decoder illustrating an example of a conversion of symbol transition numbers to bits for a 3-wire system (for n=3 with 7 symbols per group).

FIG. 17 is a block diagram of an exemplary decoder illustrating an example of a conversion of symbol transition numbers to bits for a 3-wire system (for n=3 with 7 symbols per group). A receiver device 1702 may include a plurality of receivers 1703 that receive the raw symbols over a plurality of n wires, a raw symbol-to-sequential symbol number converter 1706, a sequential symbol number-to-symbol transition number converter 1708, and a symbol transition number-to-raw bits converter 1710. The receiver 1702 and decoder 1704 may operate similar to that illustrated in FIG. 6.

Exemplary Conversion Between Sequential Symbols and Symbol Transition Number

FIG. 8 illustrates the conversion between sequential symbols and symbol transition numbers. This conversion maps each transition from a previous sequential symbol number (Ps) to a current sequential symbol number (Cs) to a transition number (T). At the transmitter device, the symbol transition numbers are being converted to sequential symbol numbers. Because of the relative conversion scheme being used, the transition numbers guarantee that no two consecutive sequential symbol numbers 804 will be the same.

In one example for a 3-wire system, there are six raw symbols assigned to six sequential symbol numbers S0, S1, S2, S3, S4, and S5. For the six sequential symbol numbers 804, Table 802 illustrates how a transition number (T) may be assigned based on a previous sequential symbol number (Ps) and the current sequential symbol number (Cs).

In this example, the transition number T may be assigned according to:

$T = Ps + 1 \leq Cs$ $?Cs - (Ps+1)$ $:Cs - (Ps+1) + 6$

Conversely, the current sequential symbol number (Cs) may be assigned according to:

$Cs = Ps + 1 + T \leq 6$ $?Ps + 1 + T$ $:Ps + 1 + T - 6$

A similar approach may be used for an n-wire system by constructing a mapping of sequential symbol number to transition number table for any n (e.g., n=4, 5, 6, . . . ) that guarantees that the raw symbols will change.

For example, in the case of an n-wire system, the transition number T may be assigned according to:

$T = Ps + 1 \leq Cs$ $?Cs - (Ps+1)$ $:Cs - (Ps+1) + n!$

Conversely, in the case of an n-wire system, the current sequential symbol number (Cs) may be assigned according to:

$Cs = Ps + 1 + T < n!$ $?Ps + 1 + T$ $:Ps + 1 + T - n!$

Exemplary Conversion Between Sequential Symbol Numbers and Raw Symbols

FIG. 9 is a table illustrating the conversion between raw values (for a n=3 wire system) to a sequential symbol number. In this example for n=3, the combinations of raw data values X, Y, and Z may be mapped to one of a set of sequential symbol number 0-5. The combination of raw values X, Y, and Z (e.g., {Z, Y, Z}) represents a raw symbol. The mnemonics −x, +x, +y, −y, +z, and −z are used to represent each of the six raw symbols for the 3-phase system (where n=3). Because the raw symbol is guaranteed to change every cycle (i.e., no two consecutive raw symbols are the same), the transition from one raw symbol to the next raw symbol can be used to extract a clock signal.

Exemplary 3-Wire Transcoding System with Embedded Timing Information

Figure 27:
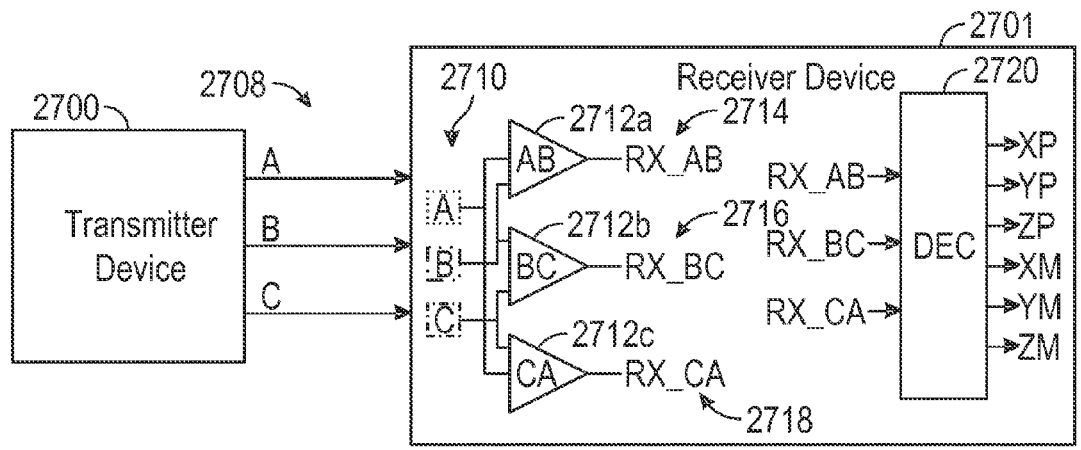
FIG. 27 illustrates a 3-wire differential signaling scheme with an integrated clock based on state transitions (raw symbol transitions).
Figure 27:
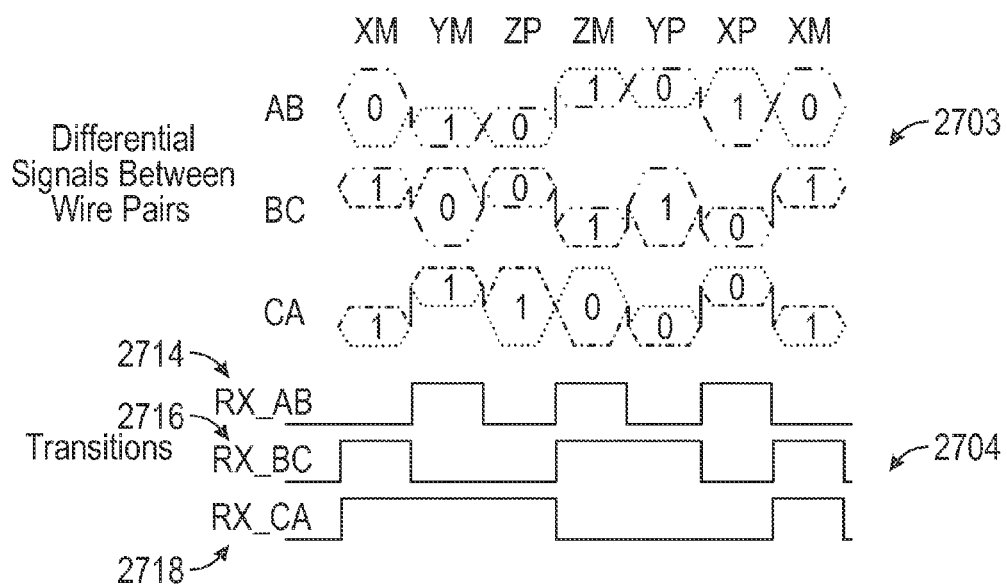
Figure 27:
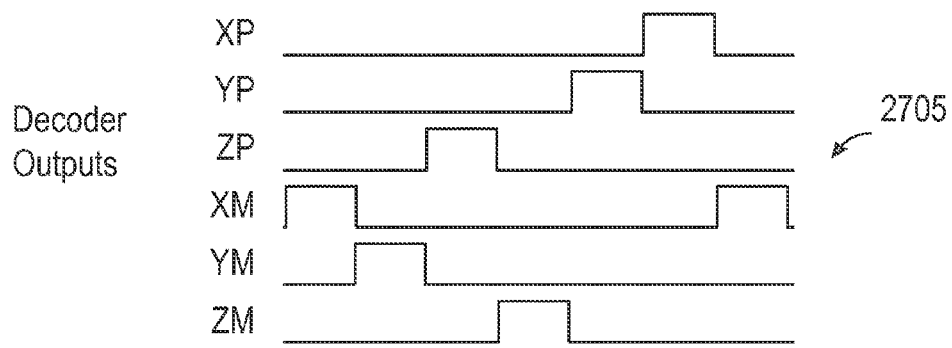

FIG. 27 illustrates a 3-wire differential signaling scheme between a transmitter device 2700 and a receiver device 2701 in which a clock (timing information) is embedded based the states defined by differential signals among conductors, wires, or lines A, B, and C.

The transmitter device 2700 and receiver device 2701 may communicate over a multi-line bus 2708. In this example, three lines A, B, and C are used for the bus 2708. The receiver device 2701 may include a three-port receiver 2710 to couple the receiver device 2701 to the bus 2708.

In one example, differential signal encoding/decoding, as illustrated in FIGS. 4-9, may be used to transmit signals from the transmitter device 2700 the receiver device 2701. As part of the receiver termination network, each of a plurality of receivers 2712 may be configured to take two of the three lines A, B, and C and provide a different signal. For instance, a first line A and a second line B may serve to provide a first differential signal RX_AB 2714, the second line B and a third line C may serve to provide a second differential signal RX_BC 2716, and the first line A and the third line C may serve to provide a third differential signal RX_CA 2718 RX. These differential signals 2714, 2716, and 2718 may serve as inputs to a decoder circuit 2720. The decoder circuit 2720 decodes the three differential signals RX_AB 2714, RX_BC 2716, and RX_CA 2718 and outputs the six states XM, YM, ZM, ZP, YP, and XP (also represented as −x, −y, −z, +z, +y, and +x in FIG. 9).

A state diagram 2703 illustrates the six (6) states XM, YM, ZM, ZP, YP, and XP that may be defined by the differential signals 2714, 2716, and 2718 carried by the three conductors A, B, and C 2708. As can be observed, the voltage levels across the three differential signals 2714, 2716, and 2718 may be mapped to different combinations of ones (1) and zeros (0). For instance, the differential signal voltage levels for state XM may be associated with "011", state YM may be associated with "101", state ZP may be associated with "001", state ZM may be associated with "110", state YP may associated with "010", and state XP may be associated with "100".

In addition to the information encoded in the states (e.g., 3 bits per state), information may also be encoded based on transitions between the states. Note that transition between any two states (XM, YM, ZM, ZP, YP, and XP) occurs in a single step without traversing intermediate states. As such, differential data transmission schemes based on the state diagram 2703 would be free of state transition decoding problems. Because of this encoding, no two consecutive raw symbols are the same. The guaranteed transition of raw symbols (i.e., change of states XM, YM, ZM, ZP, YP, and XP every cycle) permits using such transition to generate or extract a clock at the receiver device 2701.

Each of the conductors, wires, or lines of the bus 2708 may be driven High, driven Low, or undriven, with only one conductor being undriven in any single cycle. In one embodiment, three differential signals, RX_AB 2714, RX_BC 2716, and RX_CA 2718 (e.g., received by a decoder 2720 within receiver device 2701), are defined as positive differential voltage to logic 1 and negative differential voltage to logic 0 between conductor A relative to conductor B, conductor B relative to conductor C, and conductor C relative to conductor A respectively. Example waveforms of the three differential signals 2714, 2716, and 2718 are illustrated in the diagram 2704.

Six possible states (excluding the states that cause a zero differential voltage between conductor A relative to conductor B, conductor B relative to conductor C, and conductor C relative to conductor A) are defined as XM, YM, ZP, ZM, YP, XP, and XM by states of the signals RX_AB 2714, RX_BC 2716, and RX_CA 2718 according to state diagram 2703.

State signals corresponding to the six possible states XM, YM, ZP, ZM, YP, XP, and XM are generated from the differential signals RX_AB 2714, RX_BC 2716, and RX_CA 2718 by a decoder block 2720 (DEC), in the receiver device 2701, and exemplary waveforms of the state signals are shown in the diagram 2705.

In one embodiment, a state transition from a state, XM, YM, ZP, ZM, YP, XP, or XM, to a different state always occurs every single cycle. Consequently, the state transition may be used to represent a clock signal that is transmitted from the transmitter device 2700 to the receiver device 2701. The receiver device 2701 may then extract the clock signal from the guaranteed state transitions (i.e., guaranteed transitions between consecutive raw symbols).

Exemplary Termination Networks

Figure 10:
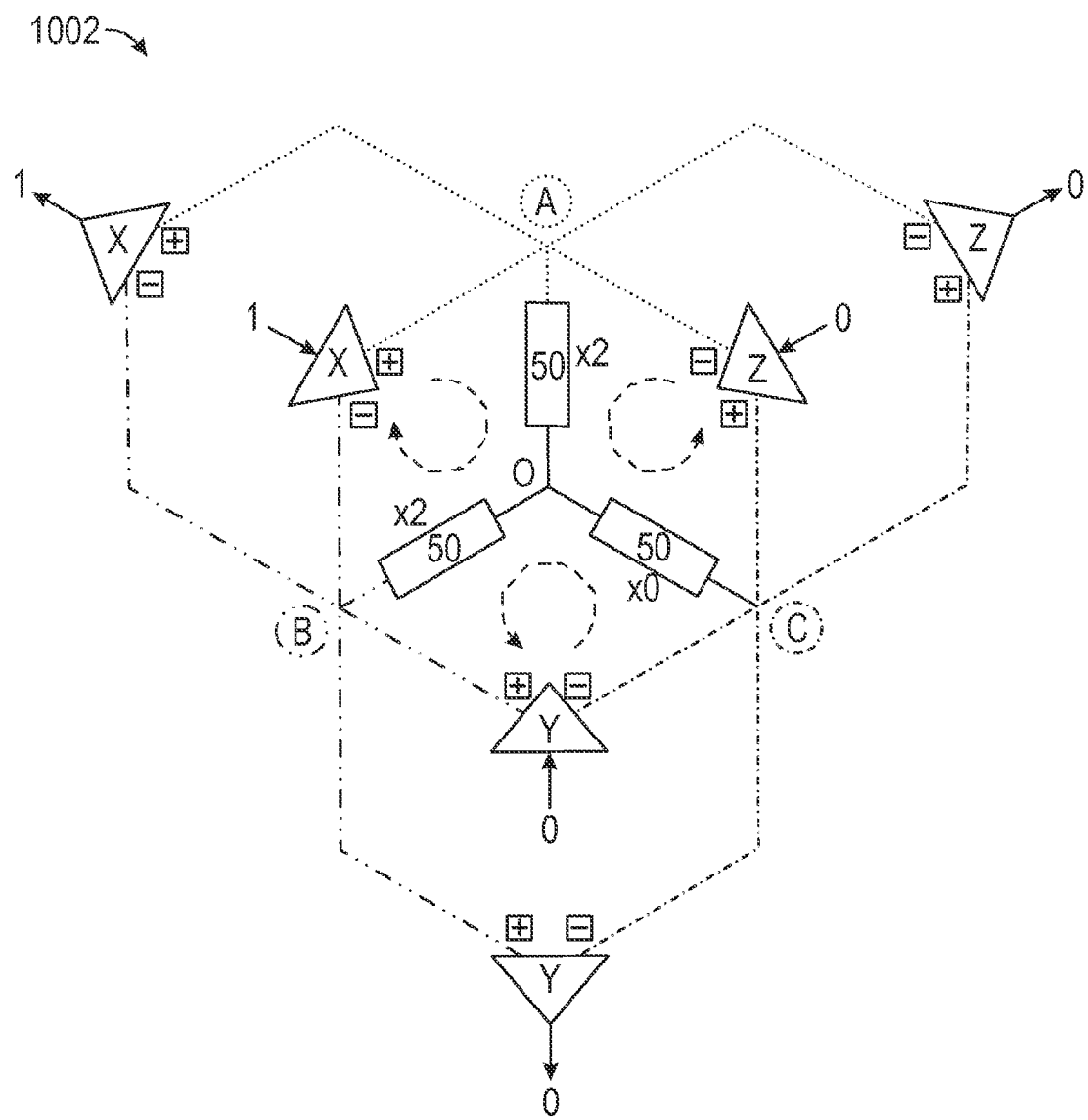
FIG. 10 illustrates a 3-wire termination network showing the input drivers and output receivers as well as the current flow among the various nodes.

FIG. 10 illustrates a 3-wire termination network 1002 showing the input to drivers and output from receivers as well as the current flow among the various nodes. This transcoding scheme for n=3 has two patterns (ZYX)=(000) and (111) which cause a zero differential voltage and are thus illegal states. Zero differential voltages are illegal because they cannot be distinguished from each other, thus preventing accurate decoding. The illegal states must not be used for encoding. The remaining six (legal) states are (ZYX)=(001), (010), (100), (110), (101), and (011).

Figure 11A:
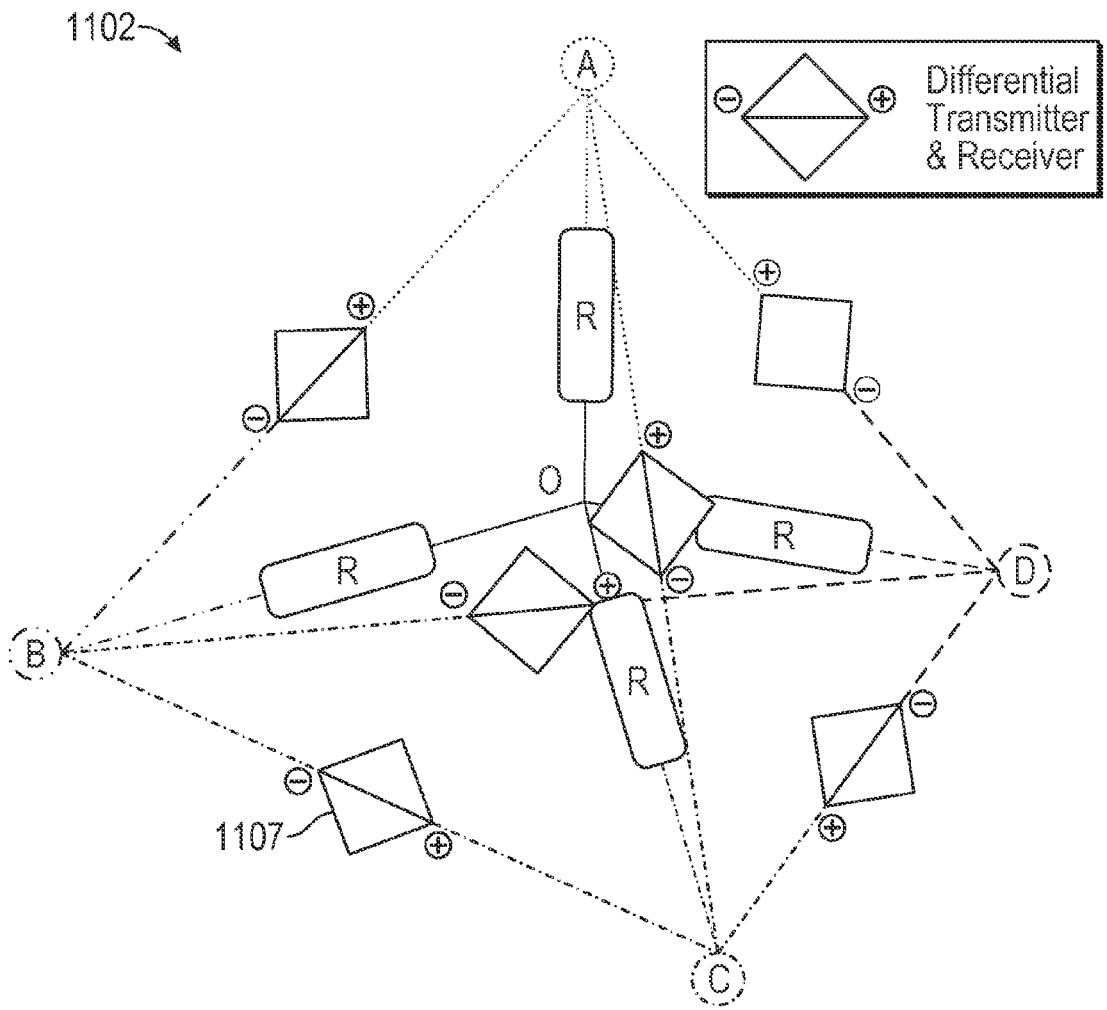
FIG. 11 (comprising FIGS. 11A and 11B) illustrates a 4-wire termination network showing the input drivers and output receivers as well as the current flow among the various nodes.
Figure 11B:
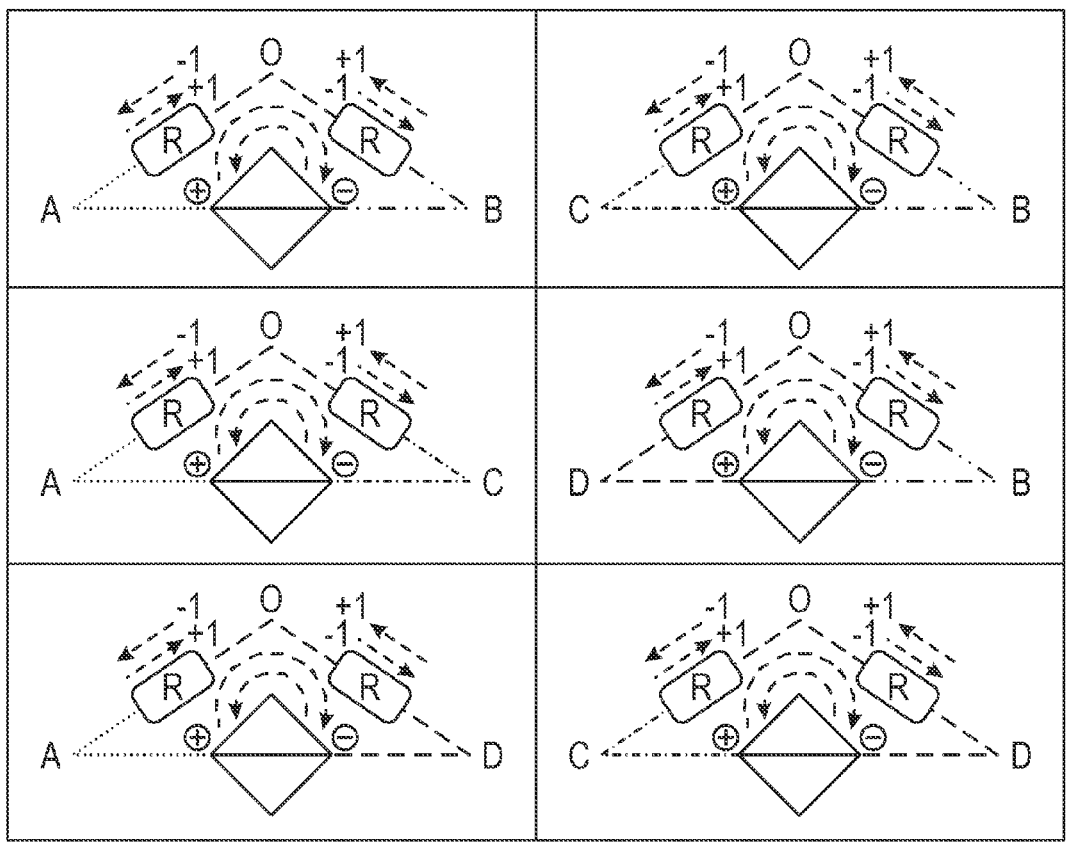

FIG. 11 (comprising FIGS. 11A and 11B) illustrates a 4-wire termination network 1102 showing the input to drivers and output from receivers as well as the current flow 1104 among the various nodes. The 4-wire termination network 1102 includes four termination resistors, six differential drivers and six differential receivers (drivers/sinks), and use three differential voltage levels. The table 1106 illustrates the possible unit current flows across each termination resistance R. As can be observed from the termination network 1102, each termination resistance R is couple to three (3) drivers/sinks 1107. Assuming a unit current of +1 or −1 from each driver/sink, then table 1106 illustrates the possible net current flows for each termination resistance R: +3, +1, −1, −3.

Figure 12:
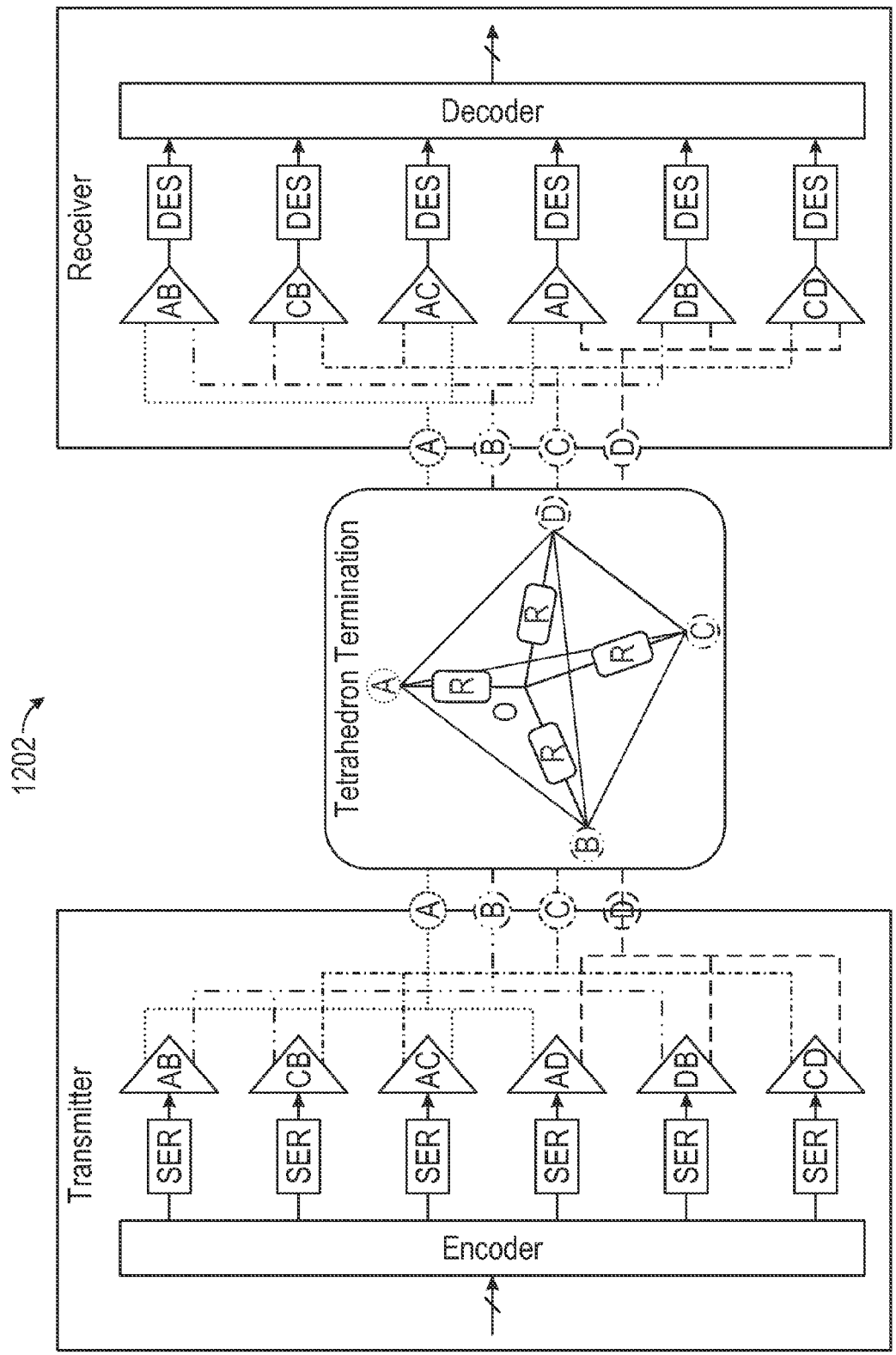
FIG. 12 illustrates a transmitter to receiver transcoding scheme showing the transmitter drivers, receiver drivers, and 4-wire termination network.

FIG. 12 illustrates a transmitter to receiver transcoding scheme showing the transmitter drivers, receiver drivers, and 4-wire termination network.

The 4-wire termination network 1102 of FIGS. 11 and 12 has 64 possible states (i.e., six drivers and 2^6 states). However, as further described with reference to FIG. 13 below, of the 64 possible states, 40 are illegal states because they result in zero differential voltages (as illustrated in FIG. 13). For each termination resistance R, there are four possible currents (magnitude and direction): −3, −1, +1, and +3 for one driver. The differential voltage of XY becomes zero (0) when two resistors (XO and YO) have currents of the same size and same direction. Thus, only the remaining 24 "non-zero" states may be used a raw symbols.

FIG. 13 (comprising FIGS. 13A and 13B) is a table showing the various combinations of raw symbols and those symbols having zero differential voltage for n=4. This table may be interpreted with respect to the 4-wire termination network of FIGS. 11 and 12. Sraw refers to the raw symbols formed by the differential signals at CD, DB, AD, AC, CB, and AB, in FIG. 12. The voltage at each Rterm refers to the voltage across each resistor R between a central node 0 and each node A in the termination network 1102 in FIG. 11. In this example, assuming a unitary resistance R, the voltage across each resistance Rterm is given as +3, +1, −1, or −3 as in the possible currents in table 1106 in FIG. 11. As a result of these voltages across each Rterm, a differential voltage across each driver/sink (DB, CD, AD, AC, CD, and AB), can be ascertained in the termination network 1102 in FIG. 11. In some cases, the voltages across two resistor pairs Rterm for a given differential transmitter/receiver cancel each other out, resulting in a "0" differential voltage. As a result, such conditions are undistinguishable raw symbols Sraw where such conditions occur are undecodable/indistinguishable and considered "illegal" and not used.

FIG. 14 illustrates a table with the non-zero differential voltage raw symbols (Sraw) that have been obtained from FIGS. 13A and 13B. Because only a subset of the possible combinations may serve as a valid raw symbol, a mapping may be used to guarantee that an illegal state is never used as a raw symbol.

For any given number of n wires (e.g., conductors, lines, etc.), a similar table is generated and used to define the raw symbols (from the valid "non-zero" states). A mapping of raw symbols to sequential symbols may be done as illustrated in FIG. 9. Note that this mapping guarantees that only valid symbols ("non-zero differential voltage states") are transmitted. Because of the symbol transition number to sequential symbol conversion that occurs at a transmitter prior to transmission of the raw symbols, no two consecutive raw symbols will be the same, they always change. Even if the exact same group of bits are being transmitted twice or more in a row (e.g., all 1s or all 0s bits), the raw bits will be different. This change in raw symbols guarantees a "transition" every time a raw symbol is transmitted. Consequently, a clock can be extracted from such guaranteed transition of the raw symbols.

Exemplary N! Transcoding System

Figure 18:
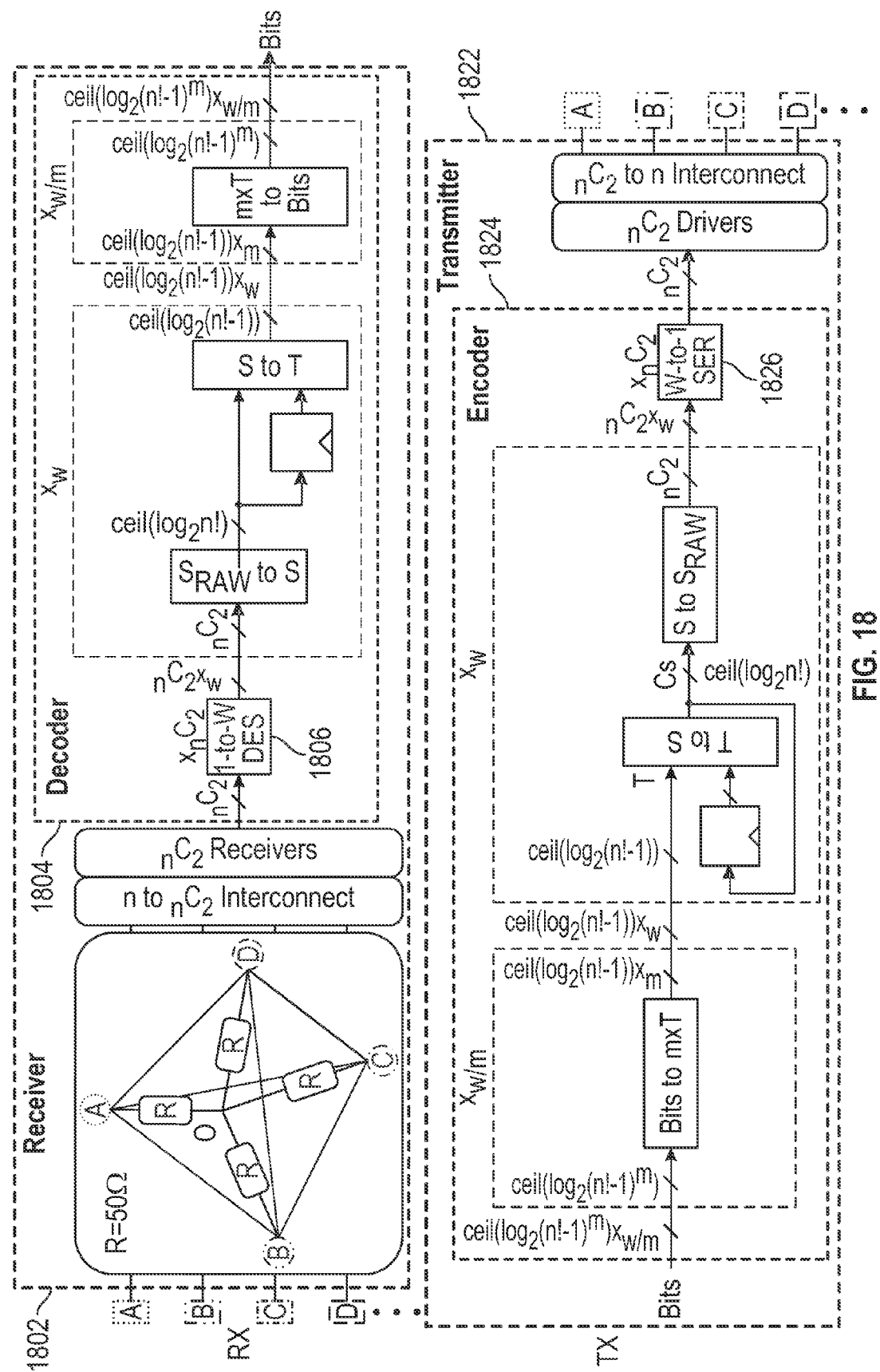
FIG. 18 is a block diagram illustrating exemplary transmitter and receiver devices for a generalized for an n-factorial (or n!) transcoding scheme.

FIG. 18 is a block diagram illustrating exemplary transmitter and receiver devices for a generalized for a n factorial (n!) transcoding scheme, where n is the number of wires (e.g., conductors, lines) used, m are the symbols/group, and w is the bit width of the deserializer (DES) 1806 and serializer (SER) 1826 blocks. In this example, a receiver device 1802 may include a decoder 1804 which includes DES block 1806. The decoder 1804 may operate similar to that illustrated and described in FIG. 6. Additionally, a transmitter device 1822 may include an encoder 1824 which includes SER block 1826. The encoder 1824 may operate similar to that illustrated and described in FIG. 5.

In one example, if n=4, m=2, and w=8 with which 2-symbols can transfer 9-bits, 8 symbols are processed at the same time by the transcoding in both TX and RX sides.

Figure 19:
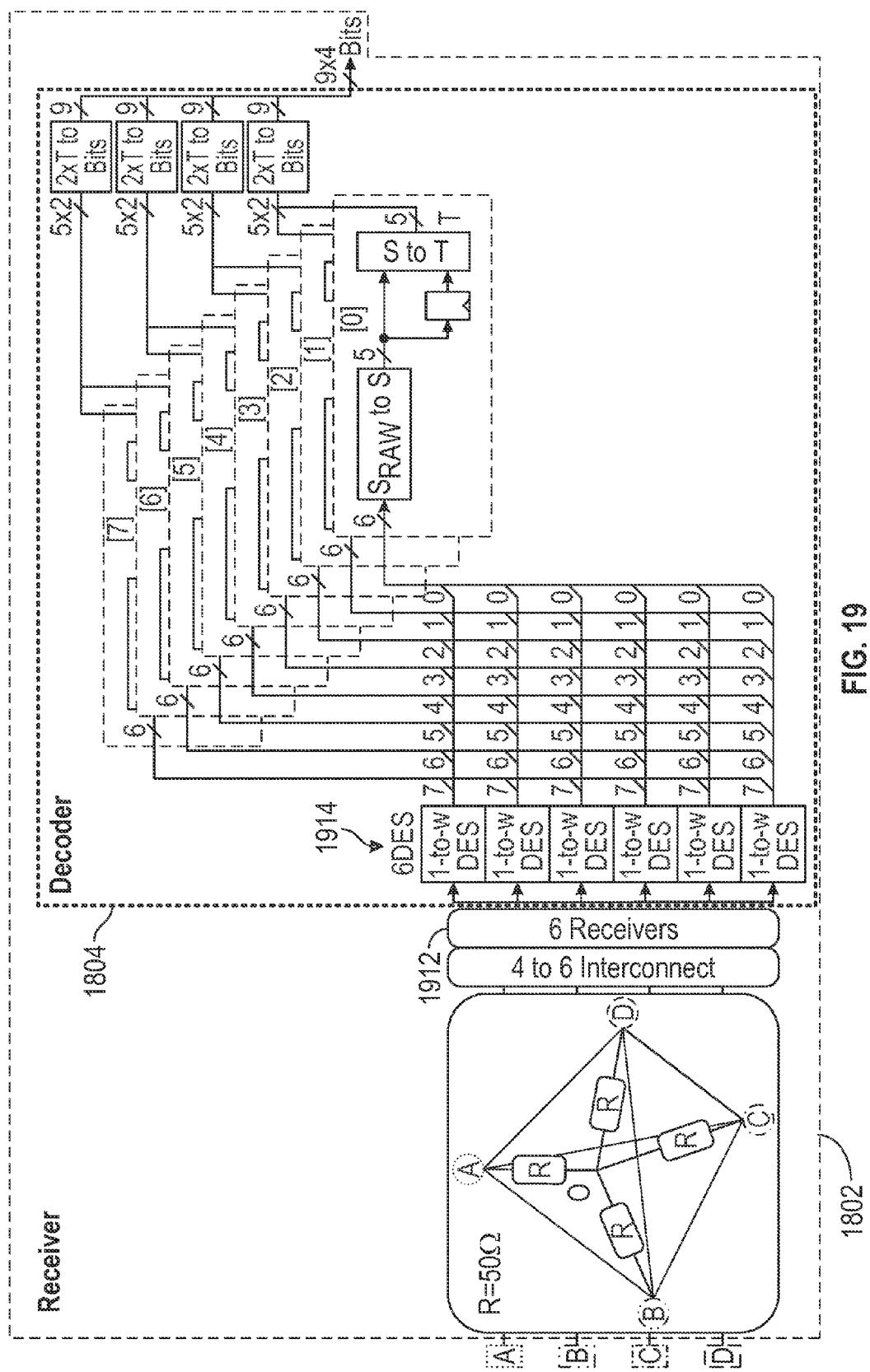
FIG. 19 is a block diagram illustrating an example of the bussed transcoding (RX side only) for 4! m=2 case when w=8.

FIG. 19 is a block diagram illustrating an example of the bussed transcoding (RX side only) for n=4, m=2, and w=8. This example, illustrates a detailed view of the receiver 1802 and decoder 1804 of FIG. 18. As illustrated, each of the six receivers 1912 may use six deserializers 1914, with separate decoder circuits being used for the decoding of different bits in a sequence of bits.

Exemplary Data Encoding Device and Method with Integrated Clock

An encoding circuit for performing multi-wire signaling encoding is provided. Various examples of such encoding circuit and functions performed therein are found in FIG. 4 (transmitter 402), FIG. 5, FIG. 7, FIG. 8, FIG. 9, FIG. 13, FIG. 14, FIG. 15 (encoder 1504), FIG. 16 (encoder 1604), and FIG. 18 (encoder 1824). A bits-to-transition number converter serves to convert a sequence of data bits into a plurality of m transition numbers. A transition number-to-sequential number converter serves to convert each transition number into a sequential number from a set of sequential numbers. Converting each transition number into a sequential number from a set of sequential numbers may include converting a plurality of transition numbers into a sequential number. A sequential number-to-raw symbol converter serves to convert the sequential number into a raw symbol.

Converting the sequential number into a raw symbol may include converting the sequential number into a plurality of raw symbols. The raw symbol may be guaranteed to have a non-zero differential voltage across all pairs of the n wires. For example, as illustrated in FIG. 27, the differential voltage 2703 across wires AB, BC, and CA is non-zero.

A plurality of differential drivers may serve to transmit the raw symbol spread over a plurality of n wires, wherein a clock signal is effectively embedded in the transmission of raw symbols since the conversion from transition number into a sequential number guarantees that no two consecutive raw symbols are the same. In various examples, the plurality of n wires is greater than or equal to 3 or 4.

For an n factorial differential signal across pairs of the n wires, $r^m$ possible different states are represented by the transition numbers, where r is n!−1. The sequential number may be selected from the transition number based on a transition from an immediately previous sequential symbol number. For example, such selection of sequential symbol numbers is illustrated in FIG. 8.

In one example for an n factorial differential signal, the plurality of differential drivers is equal to $_nC_2$, where $_nC_2$=n!/(2!(n−2)!)=n (n−1)/2. FIG. 28 illustrates a table 2802 for N-factorial differential signaling. For example, if n=6 wires, 9.49 bits per cycle can be transmitted using 720 states per cycle, 5 differential voltage levels, and 15 drivers/receivers. Consequently, significantly more information may be transmitted over the same number of wires per cycle relative to the traditional differential signaling approach.

In another example, the plurality of differential drivers is equal to n. For instance, the termination network used may be designed such that the same number of differential drivers as wires is used for all values of n=3, 4, 5, 6, etc.

Figure 25:
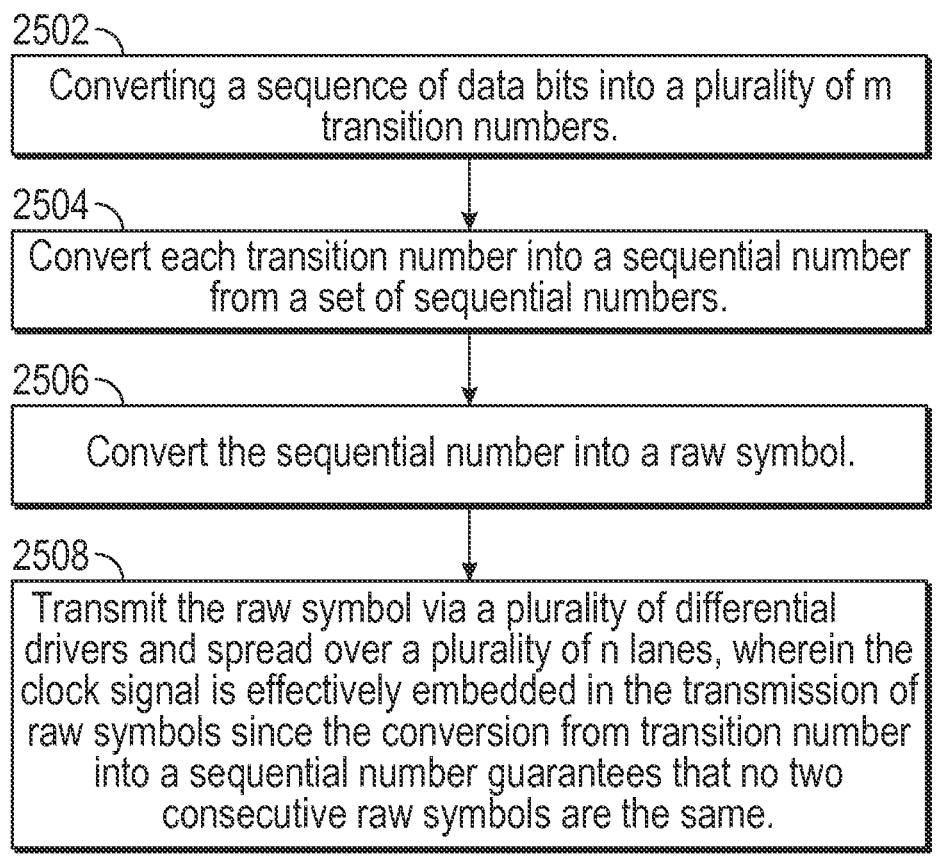
FIG. 25 illustrates a method for performing multi-wire signaling encoding in which a clock signal is encoded within symbol transitions.

FIG. 25 illustrates a method for performing multi-wire signaling encoding in which a clock signal is encoded within symbol transitions. A sequence of data bits is converted into a plurality of m transition numbers 2502. Each transition number is converted into a sequential symbol number from a set of sequential symbol numbers 2504. The sequential symbol number is converted into a raw symbol 2506. The raw symbol is transmitted spread over a plurality of differential drivers and spread over a plurality of n wires (e.g., conductors or lines), wherein the clock signal is effectively embedded in the transmission of raw symbols since the conversion from transition number into a sequential number guarantees that no two consecutive raw symbols are the same 2508.

Exemplary Decoding Device and Method with Clock Recovery

A decoding circuit for performing multi-wire signaling decoding is provided. Various examples of such decoding circuit and functions performed therein are found in FIG. 4 (receiver 402), FIG. 6, FIG. 7, FIG. 8, FIG. 9, FIG. 13, FIG. 14, FIG. 17 (decoder 1704), and FIG. 18 (decoder 1804). A plurality of differential receivers may serve to receive a raw symbol spread over a plurality of n wires. In various examples, the plurality of n wires is greater than or equal to 3 or 4.

A raw symbol-to-sequential number converter may serve to convert the raw symbol into a sequential number from a set of sequential numbers. Converting the raw symbol into a sequential number from a set of sequential numbers may include converting a plurality of raw symbols into a sequential number. The raw symbol is guaranteed to have a non-zero differential voltage across all pairs of the plurality of n wires.

A sequential number-to-transition number converter may serve to convert each sequential number to a transition number. Converting each sequential number to a transition number may include converting a sequential number into a plurality of transition numbers. The transition number may be selected from the sequential number and based on an immediately previous sequential symbol number.

A transition number-to-bits converter may serve to convert a plurality of transition numbers into a sequence of data bits. A clock data recovery circuit may extract a clock signal from the reception of raw symbols. The raw symbol reception is synchronized using the clock signal.

For an n factorial differential signaling across the n drivers, $r^m$ possible different states may be represented by the transition numbers, where r is n!−1.

Figure 26:
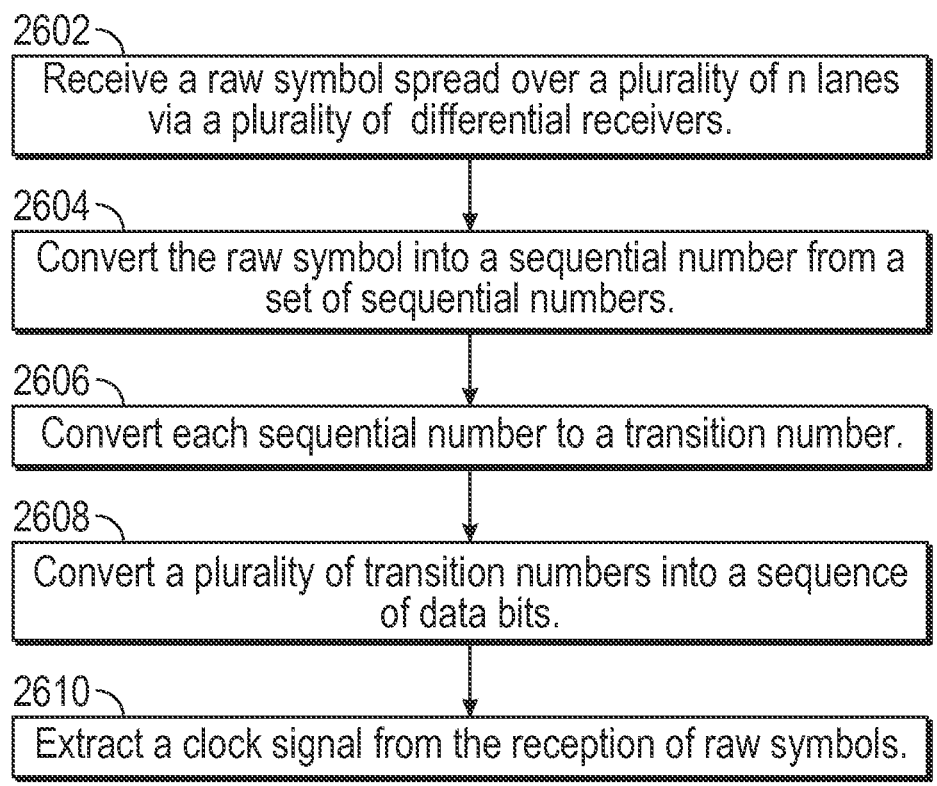
FIG. 26 illustrates a method for performing multi-wire signaling decoding in which a clock signal is extracted from symbol transitions.

FIG. 26 illustrates a method for performing multi-wire signaling decoding in which a clock signal is extracted from symbol transitions. A raw symbol is received spread over a plurality of n wires via a plurality of differential receivers 2602. The raw symbol is converted into a sequential number from a set of sequential numbers 2604. Each sequential symbol number is converted to a transition number 2606. A plurality of transition numbers are converted into a sequence of data bits 2608. A clock signal is extracted from the reception of raw symbols 2610.

Exemplary Utilizations

Depending on the number of wires used and the symbols/group selected, different utilization percentages may be achieved. "Utilization" may refer to the efficiency with which a number of bits per group may be sent. In these example, "utilization" may be represented as a percentage between an integer number of bits per group that are transmitted and a theoretical number of bits per group that may be transmitted for a given number of conductors and symbols per group.

FIG. 20 illustrates a utilization table for a 3-wire system at various symbols per group. In this example, 2.321 bits/cycle can be sent by 28 symbols/group, while a 1 symbol/group can only send 2 bits/cycle.

FIG. 21 illustrates a utilization table for a 4-wire system at various symbols per group. In this example, 4.5 bits/cycle can be sent by 2 symbols/group, while a 1 symbol/group can only send 4 bits/cycle.

FIG. 22 illustrates a utilization table for a 5-wire system at various symbols per group. In this example, 6.8947 bits/cycle can be sent by 19 symbols/group, while 1 symbol/group can only send 6 bits/cycle. Notably, 14 symbols/group can send 96 bits (32×3).

FIG. 23 illustrates a utilization table for a 6-wire system at various symbols per group. In this example, 9.483 bits/cycle can be sent by 31 symbols/group, while 1 symbol/group can only send 9 bits/cycle.

FIG. 24 illustrates a utilization table for a 7-wire system at various symbols per group. In this example, 12.296 bits/cycle can be sent by 27 symbols/group, while 1 symbol/group can only send 12 bits/cycle.

One or more of the components, steps, features and/or functions illustrated in the Figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the Figures may be configured to perform one or more of the methods, features, or steps described in the Figures. The novel algorithms described herein may also be efficiently implemented in software and/or embedded in hardware.

One or more of the components, steps, features and/or functions illustrated in the Figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the Figures may be configured to perform one or more of the methods, features, or steps described in the Figures. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine readable mediums for storing information. The term "machine readable medium" includes, but is not limited to portable or fixed storage devices, optical storage devices, wireless channels and various other mediums capable of storing, containing or carrying instruction(s) and/or data.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A method for performing multi-wire signaling encoding, comprising:
   converting a sequence of data bits into m transition numbers, where m is an integer greater than 1;
   converting each transition number into a sequential number from a set of sequential numbers;
   converting the sequential number into a raw symbol; and
   transmitting the raw symbol via a plurality of differential drivers and spread over n wires, where n is an integer greater than 1, wherein a clock signal is effectively embedded in the transmission of raw symbols since the conversion from transition number into a sequential number guarantees that no two consecutive raw symbols are the same.

2. The method of claim 1, wherein converting each transition number into a sequential number from a set of sequential numbers includes converting a plurality of transition numbers into a sequential number.

3. The method of claim 1, wherein converting the sequential number into a raw symbol includes converting the sequential number into a plurality of raw symbols.

4. The method of claim 1, where the n wires is greater than or equal to 3.

5. The method of claim 1, where the n wires is greater than or equal to 4.

6. The method of claim 1, wherein the raw symbol is guaranteed to have a non-zero differential voltage across all pairs of the n wires.

7. The method of claim 1, wherein for an n factorial differential signal across pairs of the n wires, $r^m$ possible different states are represented by the transition numbers, where r is n!−1.

8. The method of claim 1, wherein the sequential number is selected from the transition number based on a transition from an immediately previous sequential symbol number.

9. The method of claim 1, further comprising:
   synchronizing raw symbol transmissions using the clock signal.

10. An encoding circuit for performing multi-wire signaling encoding, comprising:
    a bits-to-transition number converter for converting a sequence of data bits into m transition numbers, where m is an integer greater than 1;
    a transition number-to-sequential number converter for converting each transition number into a sequential number from a set of sequential numbers;
    a sequential number-to-raw symbol converter for converting the sequential number into a raw symbol; and
    a plurality of differential drivers for transmitting the raw symbol spread over n wires, where n is an integer greater than 1, wherein a clock signal is effectively embedded in the transmission of raw symbols since the conversion from transition number into a sequential number guarantees that no two consecutive raw symbols are the same.

11. The encoding circuit of claim 10, wherein converting each transition number into a sequential number from a set of sequential numbers includes converting a plurality of transition numbers into a sequential number.

12. The encoding circuit of claim 10, wherein converting the sequential number into a raw symbol includes converting the sequential number into a plurality of raw symbols.

13. The encoding circuit of claim 10, where the n wires is greater than or equal to 3.

14. The encoding circuit of claim 10, where the n wires is greater than or equal to 4.

15. The encoding circuit of claim 10, wherein the raw symbol is guaranteed to have a non-zero differential voltage across all pairs of the n wires.

16. The encoding circuit of claim 10, wherein for an n factorial differential signal across pairs of the n wires, $r^m$ possible different states are represented by the transition numbers, where r is n!−1.

17. The encoding circuit of claim 10, wherein the plurality of differential drivers is equal to $_nC_2$, where $_nC_2=n(n-1)/2$.

18. The encoding circuit of claim 10, wherein the plurality of differential drivers is equal to n.

19. The encoding circuit of claim 10, wherein the sequential number is selected from the transition number based on a transition from an immediately previous sequential symbol number.

20. An encoding circuit, comprising:
    means for converting a sequence of data bits into m transition numbers, where m is an integer greater than 1;
    means for converting each transition number into a sequential number from a set of sequential numbers;
    means for converting the sequential number into a raw symbol; and
    means for transmitting the raw symbol via a plurality of differential drivers and spread over n wires, where n is an integer greater than 1, wherein a clock signal is effectively embedded in the transmission of raw symbols since the conversion from transition number into a sequential number guarantees that no two consecutive raw symbols are the same.

* * * * *